United States Patent
Aomori et al.

(10) Patent No.: US 6,350,557 B1
(45) Date of Patent: Feb. 26, 2002

(54) THIN-FILM TWO-TERMINAL ELEMENTS, METHOD OF PRODUCTION THEREOF, LIQUID CRYSTAL DISPLAY

(75) Inventors: Shigeru Aomori, Chiba; Yoshiki Nakatani, Kashiwa, both of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/463,700

(22) PCT Filed: Jul. 30, 1998

(86) PCT No.: PCT/JP98/03417

§ 371 Date: Jan. 31, 2000

§ 102(e) Date: Jan. 31, 2000

(87) PCT Pub. No.: WO99/07027

PCT Pub. Date: Feb. 11, 1999

(30) Foreign Application Priority Data

Jul. 31, 1997 (JP) ............................................. 9-205989
Apr. 16, 1998 (JP) ........................................... 10-106322

(51) Int. Cl.[7] ........................... G02F 1/136; H01L 49/02
(52) U.S. Cl. .......................... 430/319; 430/318; 349/51; 349/52
(58) Field of Search ................................ 430/318, 319; 349/51, 52; 438/30

(56) References Cited

FOREIGN PATENT DOCUMENTS

| JP | 1281434 | | 11/1989 |
|---|---|---|---|
| JP | A-2257123 | | 10/1990 |
| JP | 4-245229 | * | 9/1992 |
| JP | 6194677 | | 7/1994 |
| JP | 6-273804 | * | 9/1994 |
| JP | A-6301064 | | 10/1994 |
| JP | 7-020501 | * | 1/1995 |
| JP | 7-154007 | * | 6/1995 |
| JP | A-7154007 | | 6/1995 |

\* cited by examiner

Primary Examiner—John McPherson

(57) ABSTRACT

A thin-film two-terminal element including first metal film functioning as a wiring layer and a first electrode, a first insulating film formed on the first electrode of the first metal film and having a non-linear resistance property, a second metal film formed on the first insulating film and functioning as a second electrode, and a third metal film formed in a wire layer portion of the first metal film and having a smaller stress and a smaller electrical resistance than the first metal film, and a thin-film two-terminal element including, on a resinous substrate as an insulative substrate, a first metal film functioning as a wiring layer and a first electrode, a first insulating film formed on the first electrode of the first metal film and having a non-linear resistance property, a second metal film formed on the first insulating film and functioning as a second electrode, and a second insulating film formed under the second metal film except on a portion thereof which electrically functions with the first electrode via the first insulating film.

30 Claims, 12 Drawing Sheets

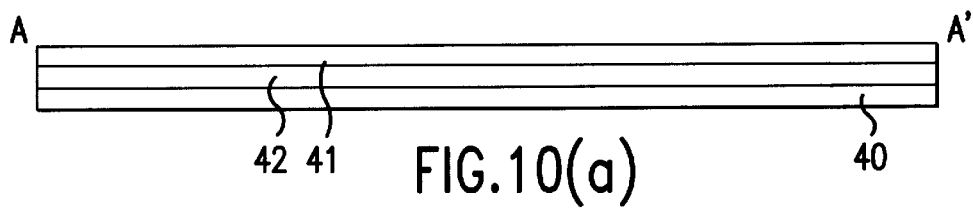
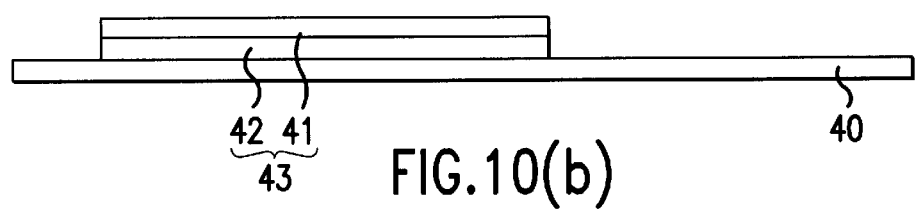
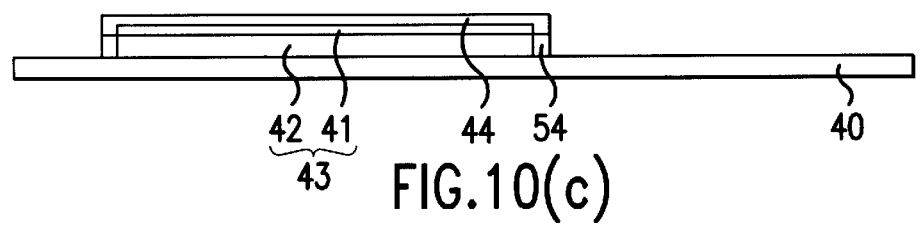
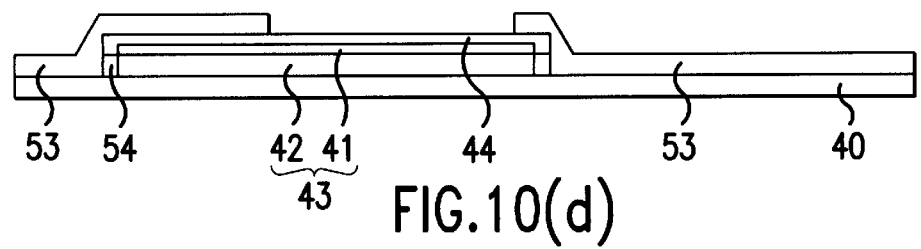
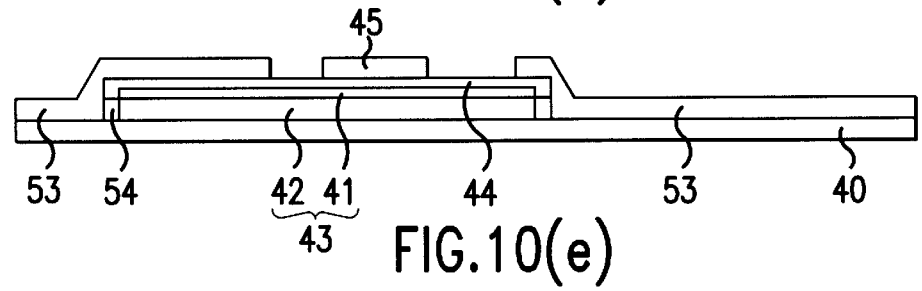
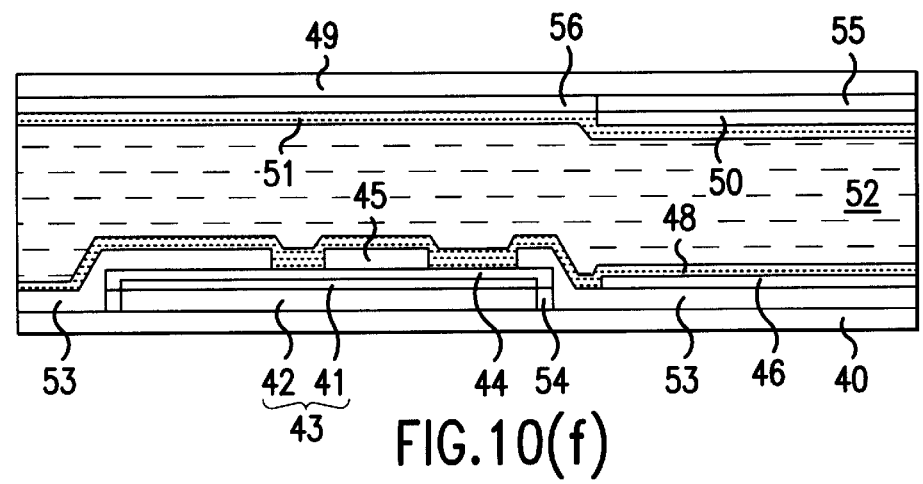

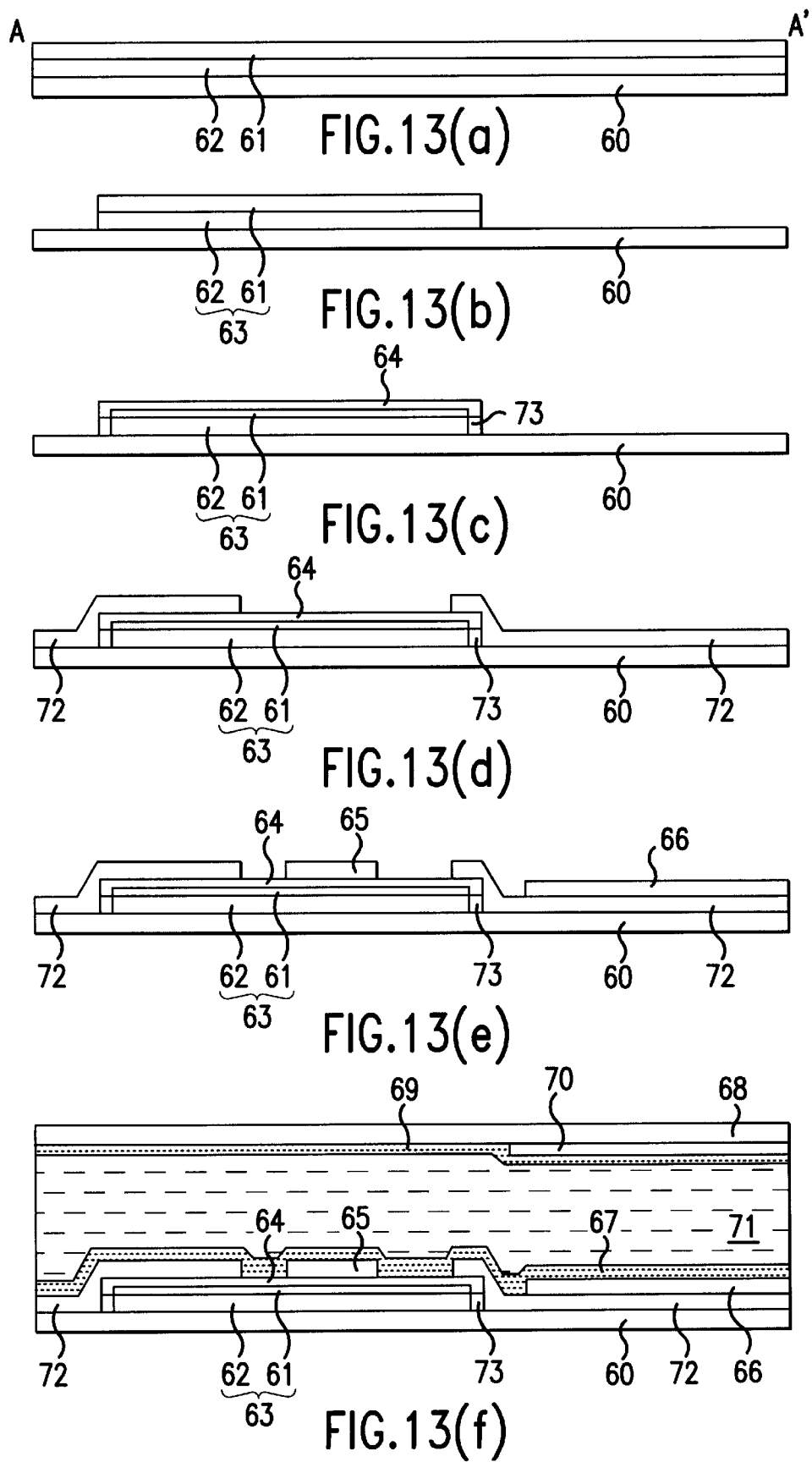

THIN-FILM TWO-TERMINAL ELEMENTS, METHOD OF PRODUCTION THEREOF, LIQUID CRYSTAL DISPLAY

This application is the national phase under 35 U.S.C. §371 of PCT International Application No. PCT/JP98/03417, which has an International filing date of Jul. 30, 1998, which designated the United States of America.

FIELD OF THE INVENTION

The present invention relates to a thin-film two-terminal element, a process for manufacturing the same and a liquid crystal display device, and more particularly, the invention relates to a thin-film two-terminal element aptly usable for office automation equipments, personal computers, portable information terminals and the like, a process for manufacturing the same and a liquid crystal display device provided with the thin-film two-terminal element.

BACKGROUND ART

Presently, as liquid crystal display devices used for personal computers or the like, often used are so-called active matrix type liquid crystal display devices in which a switching element such as a TFT (thin film transistor), an MIM (metal-insulator-metal) or the like is provided per pixel on a transparent insulative substrate such as a glass substrate in order to display images of high resolution.

Conventionally, as a semiconductor layer composing a TFT, used is a hydrogenated amorphous silicon (a-Si:H) film formed by a plasma-enhanced CVD method and a polycrystalline silicon (p-Si) or the like which is obtained by re-crystallizing an a-Si film formed by a low pressure CVD method (LPCVD method) or the like by a solid phase epitaxy method by means of thermal treatment or by a laser annealing method.

On the other hand, as a non-linear resistance film composing a MIM element, used is a film of tantalum oxide ($Ta_2O_5$) obtained by thermally oxidizing or anodizing tantalum (Ta), aluminum oxide ($Al_2O_3$), silicon nitride (SiNx) or the like.

Also, in recent rapid progress of the multimedia society, with development in the field of portable information terminal equipment which allows transfer of information at any place at any time, an increasing importance is attached to small-size, lightweight liquid display devices excellent in portability.

However, the conventional liquid crystal display devices and switching elements as mentioned above have the following problems:

For insulative substrates composing the liquid crystal display devices, usually used are non-alkali glass substrates, quartz substrates or the like as transparent insulative substrates. These substrates establish limits on production of thin, lightweight display devices required for portable information terminal equipment and the like. Also the portable information terminal equipment is likely to often encounter a state of fall, collision or the like during being carried because of its featuring portability. In this respect, the liquid crystal display devices using glass substrates, which are poor in impact resistance, have a problem.

To cope with this, simple matrix-type liquid crystal display devices are being developed which use thin, lightweight plastic substrates superior in impact resistance as insulative substrates (Flat Panel Display, p.p.123–128, 1994).

However, since the simple matrix-type liquid crystal display devices do not have switching elements for respective pixels, they are not suitable for displaying high-definition images and are used for simple display of characters or letters like pagers.

Also, if one tries to mount switching elements such as thin-film transistors, thin-film diodes (TFD, MIM) or the like on a plastic substrate with aim at high-definition display, the manufacture process becomes complicated, especially in the case of using TFTs. Further, since processing at a temperature of about 300° C. to 400° C. is required, there is a problem in that realization is difficult.

On the other hand, MIM elements, which are thin-film two-terminal elements, have simple element structure in which a non-linear resistance film is sandwiched between electrodes, and the number of production steps is small. Since the processing temperature can be lowered to 200° C. or below, it is possible to mount them on a plastic substrate. Active matrix liquid crystal display devices with use of such MIM elements are proposed by Japanese Unexamined Patent Publication Nos. HEI 6(1994)-214220 and HEI 6(1994)-281960, for example.

However, where the MIM elements are intended to be formed on a plastic substrate, there are problems as mentioned below.

First, where a plastic substrate is used as a material for the substrate, there is a problem in that gases are released from the substrate material. That is, since a plastic substrate is more liable to let through gases like vapor as compared with a glass substrate, gases like vapor penetrate from the outside into a liquid crystal layer within a panel after the panel is fabricated, and there occurs deterioration of display or the like.

To cope with this, a gas barrier layer is provided on a face contacting the outside, that is, on a face opposite to a face on which elements are formed, when the liquid crystal panel is fabricated. However, this gas barrier layer prevents penetration of exterior gases but cannot stop release of gases from the plastic substrate itself. Accordingly, during the formation of elements, for example, while a metal film or the like is formed on the substrate, gases released from the substrate are taken in by the film and cause a change in quality of a material for the metal film. As a result, in the case where such the metal film is used for electrode wiring, there occur problems such as a rise in wiring resistance.

As a solution to this, gas barrier layers may be provided on both faces, but in this case, there occur other problems such as an increase in the cost of the substrate.

Generally, for a metal wiring, a Ta film is often used with a view to using an anodized oxide film of the metal wiring as non-linear resistance film. However, since a plastic substrate is less rigid as compared with a glass substrate, a metal wiring of Ta, if formed on a plastic substrate, has a larger stress and causes a warp in the plastic substrate, exfoliation of the metal film and/or the like. There is a problem in that this makes it difficult to continue an element forming process.

In the conventional thin-film two-terminal element, since a first electrode, for example a Ta film, serves also as an interconnect, the Ta film is formed in a thickness of about 300 nm to 500 nm. In this case, the total stress given to the plastic substrate by the Ta film is represented by the following formulae (1) to (3):

Total stress: $S = \sigma \cdot d [N/m]$ (1)

Film stress: $\sigma = \sigma_1 + \sigma_T [N/m^2]$ (2)

Thermal stress: $\sigma_T = E_f(\alpha_f - \alpha_s)\Delta T [N/m^2]$ (3)

wherein $\sigma_1$: inner stress of film, $\sigma_T$: thermal stress, d: film thickness, $E_f$: Young's modulus of thin film, $\alpha_f$: thermal expansion coefficient of thin film, $\alpha_s$: thermal expansion coefficient of substrate and $\Delta T$: difference in temperature.

From the above formulae, suppose the thickness of a Ta film is 300 nm and a substrate of polyether sulfone (PES) is used as a plastic substrate, the total stress S of the Ta film on the plastic substrate is calculated as about 2,326 [N/m]. Thus, in the case where a Ta film is formed on a plastic substrate to serve also as an interconnect, the substrate deforms because of a large stress of the Ta film, as described in Japanese Unexamined Patent Publication Nos. HEI 6(1994)-214220.

As means of reducing this stress, it is contrived from the above formula to reduce the thickness of the Ta film. However, as a metal interconnect, the resistance of the Ta film becomes greater as the Ta film becomes thinner, which results in problems such as delay of display signals.

As other countermeasure, it can also be contrived to increase the thickness of the plastic substrate or to coat the surface of the substrate in order to provide rigidity.

However, with these measures, there are problems in that the thinness and lightweight, which are merits of plastic substrates, cannot be attained, and furthermore, the cost of substrates rises.

The present invention has been made in view of the above-described problems and an object of the invention is to provide a thin-film two-terminal element capable of being formed on a thin, lightweight substrate of resin excellent in impact resistance which is typified by plastics, a manufacture process therefor and a liquid crystal display device.

DISCLOSURE OF THE INVENTION

According to the present invention, provided is a thin-film two-terminal element comprising a first metal film functioning as a wiring layer and a first electrode; a first insulating film formed on the first electrode of the first metal film and having a non-linear resistance property; a second metal film formed on the first insulating film and functioning as a second electrode; and a third metal film formed in a wiring layer portion of the first metal film and having a smaller stress and a smaller electrical resistance than the first metal film.

Also, according to the present invention, provided is a process for manufacturing a thin-film two-terminal element including the steps of forming a first metal film functioning as a wiring layer and a first electrode on an insulative substrate; forming, at least in a wiring layer portion of the first metal film, a third metal layer having a smaller stress and a smaller electrical resistance than the first metal film; forming a first insulating film having a non-linear resistance property on the first electrode of the first metal film; and forming a second metal film functioning as a second electrode on the insulating film.

Further, according to the present invention, provided is a liquid crystal display device comprising an element side substrate in which a pixel electrode is formed on an insulative substrate provided with the above-described thin-film two-terminal element, the pixel electrode being connected to the second electrode composing the thin-film two-terminal element; an opposite substrate in which a transparent opposite electrode is formed on a second insulative substrate; and a liquid crystal layer sandwiched between the element side substrate and the opposite substrate.

Also, according to the present invention, provided is a thin-film two-terminal element having, formed on a resinous substrate, a first metal film functioning as a wiring layer and a first electrode; a first insulating film formed on the first electrode of the first metal film and having a non-linear resistance property; a second metal film formed on the first insulating film and functioning as a second electrode; and a second insulating film formed under the second metal film expect a portion thereof which electrically functions with the first electrode via the first insulating film.

Further, according to the present invention, provided is a process for manufacturing a thin-film two-terminal element including the steps of forming a first metal film functioning as a first electrode on a resinous substrate; forming a first insulating film having a non-linear resistance property on the first electrode; and forming a second metal film functioning as a second electrode on the first insulating film, wherein, before the second metal film is formed, a second insulating film is formed on the entire surface of the insulative substrate except a portion where the first metal film and the first insulating film are laminated.

Also, according to the present invention, provided is a liquid crystal display device including an element side substrate in which a pixel electrode is formed on the above-described thin-film two-terminal element formed on a resinous substrate, the pixel electrode being connected to the second electrode composing the thin-film two-terminal element; an opposite substrate in which a transparent opposite electrode is formed on a second insulative substrate; and a liquid crystal layer sandwiched between the element side substrate and the opposite substrate.

BRIEF DESCRIPTION OF THE DRAWINGS

FIGS. 10(a) to 10(f) are schematic sectional views of the major part illustrating a process of manufacturing the thin-film two-terminal element and the liquid crystal display device of FIGS. 9(a) and 9(b);

FIGS. 13(a) to 13(f) are schematic sectional views of the major part illustrating a process of manufacturing the thin-film two-terminal element and the liquid crystal display device of FIGS. 12(a) and 12(b).

BEST MODE OF CARRYING OUT THE INVENTION

Figure 1A:
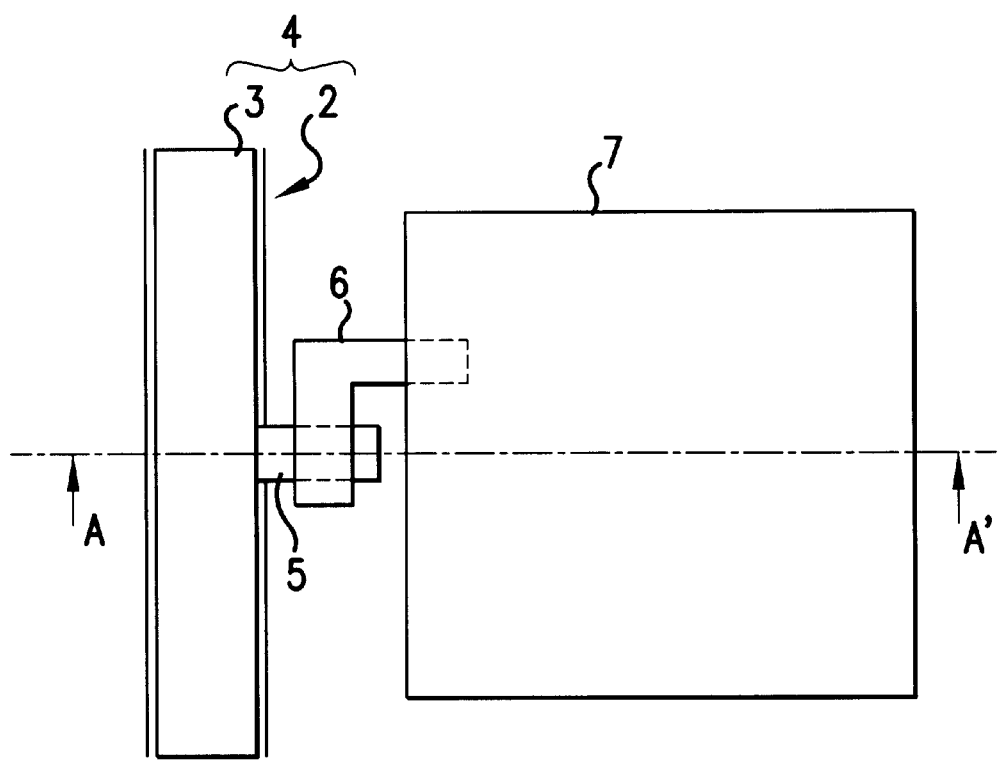
FIG. 1(a) is a schematic plan view of a major part illustrating an embodiment of a thin-film two-terminal element in accordance with the present invention.

The thin-film two-terminal element of the present invention is comprised mainly of a first metal film, a first insulating film having a non-linear resistance property and a second metal film which are laminated on an insulative substrate.

Further, in such a thin-film two-terminal element, a second insulating film may be formed in a desired region in/around the thin-film two-terminal element.

The insulative substrate is not particularly limited to any type of substrate provided that it is usually used for liquid crystal display devices and the like. For example, may be mentioned a substrate of a resin such as polyether sulfone (PES), polycarbonate (PC), polyether ether ketone (PEEK), polyethylene terephthalate (PET), polyarylate (PAR), polyether nitrile or the like, a substrate of glass, a substrate of quartz and the like, among which a substrate of a resin is preferred from the viewpoint of achieving lightweight and enhancing the impact resistance of liquid crystal display devices. The thickness of the substrate is not particularly limited, but may be about 0.4 mm to about 1.1 mm, for example.

As the first metal film, films of Al, Ta and the like may be mentioned, for example.

The first metal film may be formed by depositing the above-mentioned conductive material by a sputtering method, a vacuum deposition method, an electron beam (EB) deposition method, an ion plating method, an MEB method or the like as selected in consideration of a material to be used and patterning the resulting film into a desired configuration by a known method such as a photolithography and etching process. At this time, the film may be formed in a thickness of about 60 nm to about 100 nm, for example.

In the present invention, the first metal film serves as a wiring layer and a first electrode.

Where the first metal film serves as the wiring layer and the first electrode, it is preferable that a third metal layer having a smaller stress than the first metal layer is formed at least in a wiring layer portion of the first metal film. The third metal film may be formed in a layer either overlying or underlying the wiring layer portion of the first metal layer. If the third layer is disposed in the underlying layer, the third layer may be formed not only under the wiring layer portion but also under a part of or the whole of an electrode portion of the first metal layer. If the third layer is disposed in the overlying layer, the third layer may be formed not only in the wiring layer portion but also in a portion other than an element forming portion in the electrode portion of the first metal film.

Preferably, the third metal film is a film having a smaller stress and a smaller electrical resistance than the first metal film. The phrase "having a smaller stress" means that the total stress applied on the substrate by the metal film as calculated according to the above formulae (1) to (3) is small.

A material for the third metal film can be selected as appropriate for use from materials satisfying the above requirements in consideration of a combination with the first metal film used. For example, conductive materials such as Al, Ti, Mo, Ag, Cu and alloys thereof may be mentioned. The third metal film is preferably formed of a single-layer film but may be formed of a laminate film. Also, if the thickness is so selected that the influence of the stress on the substrate is small, other materials than mentioned above can be used.

The first insulating film having the non-linear resistance property means an insulating film formed on the first electrode portion of the first metal film. However, the first insulating film may be formed not only on the first electrode portion but also to cover the entire surface of the first metal film including its sides.

As an example of the first insulating film, an anodized film of the first metal film may be mentioned. Particularly, $Ta_2O_5$, $Al_2O_3$ and the like may be mentioned. The thickness of the insulating film at this time may be about 40 nm to about 80 nm, for example.

The first insulating film may be formed by a known method, for example, by an anodization method or the like. More particularly, it may be formed by immersing the insulative substrate having the first metal film formed thereon in an anodizing solution and applying formation voltage/formation current thereto. Here, as anodizing solutions, electrolytes such as ammonium tartrate, ammonium borate, oxalic acid or the like may be mentioned. These anodizing solutions may be used in a concentration of about one to several percents.

Where the third metal film has a surface which is not covered with the first metal film, the surface is preferably covered with a protective film. The protective film is not particularly limited to any type provided that it is a film for protecting the surface of the third metal film in a variety of later steps. For example, the protective film is preferably formed by anodization on the surface or sides of the third metal film at the same time as the first metal film is anodized. At this time, the protective film can be formed in an appropriate thickness depending upon anodizing conditions.

The second metal film may be formed, for example, of Al, Ti, Mo, Ag, Cu, Cr or the like by an ordinary method such as a sputtering method, an electrical resistance heating deposition method, an EB deposition method or the like. The temperature of the substrate during the formation of the film is preferably about 150° C. or below taking the material for the substrate into consideration.

Suitably, the second insulating film is formed under the second electrode at least in a region other than a region of the second electrode that electrically functions with the first metal film (the first electrode) via the non-linear resistance film. Further, the second insulating film may be formed on the first electrode in a region where the second electrode is not formed, on a side of the first electrode and on the insulative substrate in a region surrounding the first electrode, that is, the second insulating film may be formed to cover an edge portion and surroundings of the first electrode.

Preferably the second insulating film is a film having a barrier property to cut off gas molecules and/or liquid molecules which are generated from the insulative substrate and/or pass through the insulative substrate, as well as an insulative property to enhance electrical insulation at the bottom of the region of the second electrode other than the region thereof that electrically functions with the first electrode via the non-linear resistance film. Especially, in order to ensure the barrier property, the second insulating film is required to be a more or less dense insulating film.

The second insulating film may be formed of an inorganic insulating film such as of $SiN_x$, $SiO_2$, $Ta_2O_5$ or $Al_2O_3$, an organic insulating film such as polyimide or the like.

The second insulating film may be formed by a sputtering method, a CVD method, a spin coating method, an ion beam deposition method or the like. An opening in the second insulating film may be formed by a method in conformance with the above-described patterning of the first metal film.

The second insulating film can realize its barrier and insulative properties by being formed in the above-mentioned position and of the above mentioned material.

According to the process for manufacturing a thin-film two-terminal element of the present invention, firstly, the first metal film which serves as the wiring layer and the first electrode is formed on the insulative substrate. The methods of forming and pattering the first metal layer at this time are described above.

In the case where the third metal film is formed in a layer underlying the first metal layer, the third metal film is formed in a region of the first metal. film where at least the wiring layer is to be formed. The methods of forming and pattering the third metal film are similar to those for the first metal film. At this time, so far as the third metal film is formed in a region including the region where the wiring layer is to be formed, the third metal film may be formed further in a region surrounding said region and the like. However, the third metal film is preferably formed to have a shape different from that of the first metal film to be formed in a later step.

On the other hand, in the case where the third metal film is formed in a layer overlying the first metal layer, the first metal film is first formed in a desired shape as described above, and then the third metal film is formed at least on a region of the first metal film which is the wiring layer. At this time, so far as the third metal film is formed in a region including the region where the wiring layer is formed, the third metal film may be formed further in a region surrounding said region and the like. However, the third metal film is preferably formed to have a different shape from that of the first metal film formed in the underlying layer.

Subsequently, the insulating film having the non-linear resistance property is formed on the first electrode of the first metal film. Further, the second metal film which functions as the second electrode is formed thereon. The methods of forming the insulating film at this time may be conducted as described above, and the methods of forming and patterning the second metal film may be conducted as the first metal film.

In the case of producing a thin-film two-terminal element which further includes a second insulating film, prior to forming the second electrode of the second metal film, the second insulating film is formed by the above-described method and an opening is made at a predetermined spot, and then the second electrode may be formed as described above.

Further, the liquid crystal device of the present invention is mainly composed of an element side substrate having, on an insulative substrate provided with the thin-film two-terminal element of the present invention, a pixel electrode connected to the second electrode constituting the thin-film two-terminal element, and an opposite side substrate having a transparent opposite electrode on a second insulative substrate, and a liquid crystal layer sandwiched between these substrates.

The pixel electrode may be formed of a conductive transparent material such as ITO, ZnO or $SnO_2$, a metal film or the like. In this case, the thickness may be about 400 Å to about 1,500 Å, for example. The pixel electrode may be formed by depositing the above-mentioned material by a known method such as a sputtering method, a vacuum deposition method, an EB deposition method, an ion plating method, an MEB method, a screen printing method or the like as appropriately selected in consideration of a material to be used and by patterning the resulting film into a desired configuration by a known method such as a photography and etching process.

In the case where the pixel electrode is formed of a metal film, the pixel electrode may be formed to be integrated with the second electrode constituting the thin-film two-terminal element, as a reflection pixel electrode.

As the second insulative substrate, an insulative substrate similar to that used for forming the thin-film two-terminal element may be used, and especially a transparent substrate is preferred.

The transparent opposite electrode is not particularly limited to any material provided that it is an ordinarily used conductive transparent material. For example, ITO, ZnO, $SnO_2$ and the like may be mentioned. The thickness thereof is not particularly limited, and for example, about 100 nm to about 500 nm may be mentioned.

It is noted that, a black matrix, color filters and the like may be formed on the opposite side substrate depending on the type of the display device such as a transmission type liquid crystal display device, a reflection type liquid crystal display device or the like.

For the liquid crystal layer, any liquid crystal composition that is used in liquid crystal display devices may be used without any particular limitation.

Embodiments of the thin-film two-terminal element, the process for manufacturing the same and the liquid crystal display device of the invention are described with reference to the drawings. However, these embodiments are not intended to limit the scope of the invention.

Embodiment 1

Figure 1B:
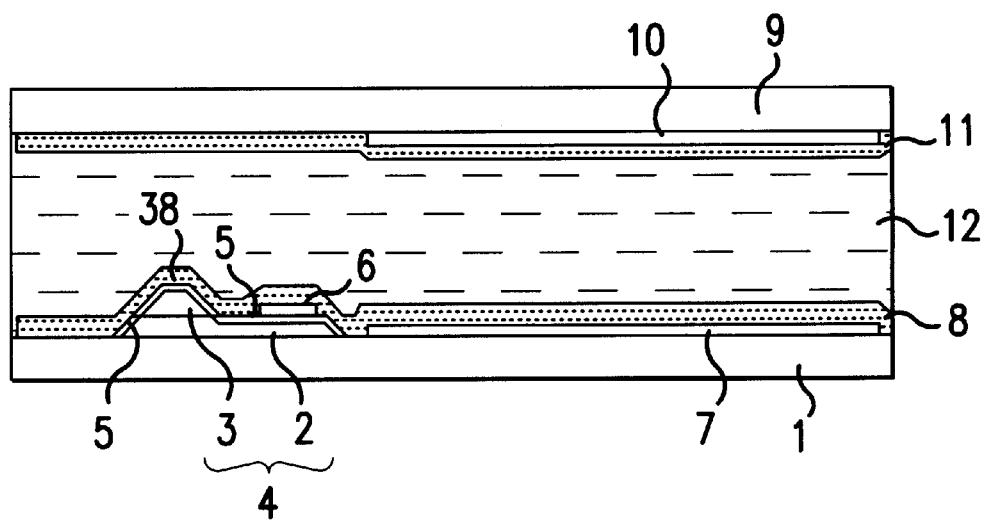
FIG. 1(b) is a schematic sectional view of the major part illustrating a pixel of a liquid crystal display device having the thin-film two-terminal element in accordance with the present invention mounted thereon.

In FIG. 1(a), there is shown a plan view of a thin-film two-terminal element in one pixel of a liquid crystal display device in accordance with an embodiment of the present invention. In FIG. 1(b), there is shown a cross-sectional view of a major part taken on line A–A' in FIG. 1(a).

As shown in FIG. 1(a), this thin-film two-terminal element is composed mainly of a first metal film 2 formed on an insulative resinous substrate 1, an insulating film 5 having a non-linear resistance property and a second electrode 6 made of a second metal film.

A third metal film 3 is formed on a wiring layer of the first metal film 2. The first metal film 2 and the third metal film 3 are together referred to as a first electrode interconnect 4.

The first electrode of the first metal film 2 is covered with the insulating film 5, and the second electrode 6 is formed on the laminated first electrode and insulating film 5.

Further, as shown in FIG. 1(b), the liquid crystal display device is constructed to be provided with the above-described thin-film two-terminal element per pixel.

That is, in this liquid crystal display device, a pixel electrode 7 is formed on the substrate 1 where the thin-film two-terminal element is not formed. The pixel electrode 7 is connected to the second electrode 6 of the thin-film two-terminal element. Further, an orientation film 8 is formed on the entire surface of the substrate 1 including thin-film two-terminal elements and pixel electrodes 7. An insulative transparent resinous substrate 9 is placed as opposed to the substrate 1. On this substrate 9, transparent opposite electrodes 10 are formed as opposed to the pixel electrodes 7 and an orientation film 11 is formed. Further, a liquid crystal layer 12 is sandwiched between the substrates 1 and 9.

The process of manufacturing the above-described thin-film two-terminal element and liquid crystal devices is now explained with reference to FIG. 2.

Figure 2A:
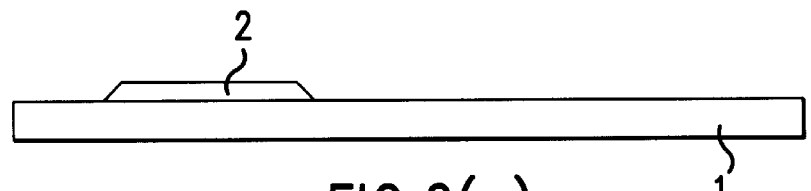
FIGS. 2(a) to 2(e) are schematic sectional views of the major part illustrating a process of manufacturing the thin-film two-terminal element and the liquid crystal display device of FIGS. 1(a) and 1(b)

First, as shown in FIG. 2(a), a substrate of polyether sulfone (PES) of 0.4 mm thickness is used as the insulative resinous substrate 1, and a Ta film which serves as the first metal film 2 is formed in a thickness of about 100 nm on the substrate 1 by a sputtering method. Film forming conditions at this time are a substrate temperature of 150° C. during the formation of the film, an Ar pressure of 0.5 Pa and an RF power of 3.4 W/cm$^2$. Next, the Ta film is patterned into a predetermined configuration by photolithography and etching, thereby to form the first metal film 2 in a predetermined position on the substrate 1.

Figure 2B:
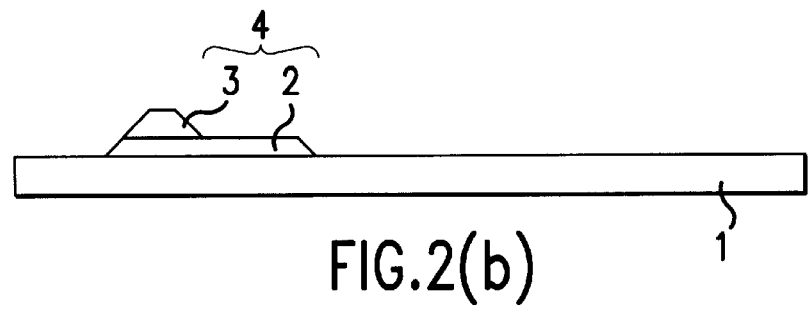

Subsequently, as shown in FIG. 2(b), an Al film which serves as the third metal film 3 is formed in a thickness of about 150 nm so as to cover the Ta film by a sputtering method. Film forming conditions at this time are a substrate temperature of 150° C. during the formation of the film, an Ar pressure of 2 Pa and an RF power of 1.7 W/cm$^2$.

The total stress S of the Al film on the substrate at this time is S=30.58 N/m (compression stress) from the foregoing formula (1). Accordingly, since the Al film has a much smaller stress as compared with the Ta film, the substrate is less affected.

Next, this Al film is patterned into a predetermined configuration by photolithography and etching such that the Al film remains on a portion of the Ta film which serves as the wiring layer of the first metal film 2. Thereby, formed is the first electrode interconnect 4 having the functions of the wiring layer and the first electrode.

Figure 2C:
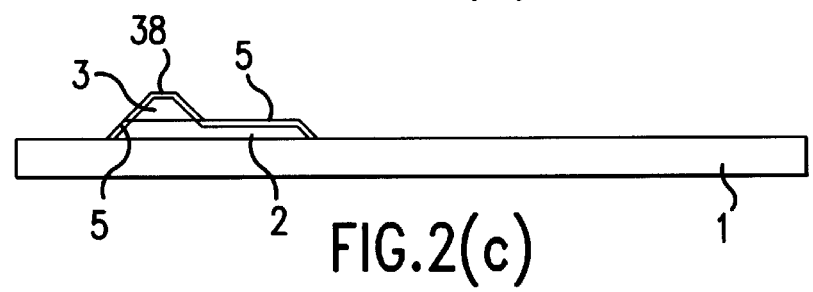

Next, as shown in FIG. 2(c), an anodized film of Ta$_2$O$_5$ which serves as the insulating film 5 of the thin-film two-terminal element having the non-linear resistance property is formed on a surface of the Ta film which is not covered with the Al film, by an anodizing process.

More particularly, using a 1% solution of ammonium borate as an anodizing solution, the Ta$_2$O$_5$ film is formed by immersing the substrate 1 with the first electrode interconnect 4 formed thereon in the solution at room temperature at a formation voltage of 35V.

Figure 3:
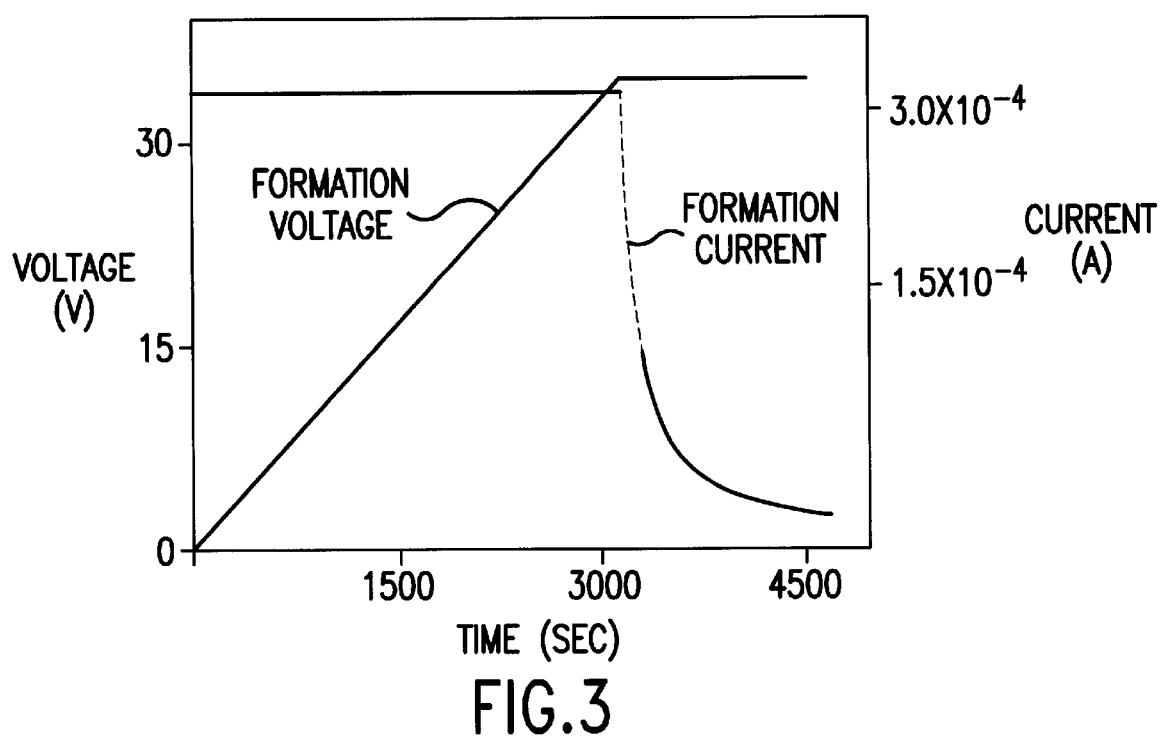
FIG. 3 is a graphical representation showing changes in formation current and formation voltage with respect to anodization time during an anodization process for forming a non-linear resistance film of a thin-film two-terminal element.

FIG. 3 shows changes in the formation voltage and current with respect to anodization time in the anodizing process. In this process, with use of a constant-current constant-voltage power supply, a constant-current formation is first carried out at a constant formation current of 320 mA; then, at a point of time when voltage reaches a value corresponding to the thickness of the insulating film 5 to be formed (35V in this embodiment), a constant-voltage formation is carried out for a certain time. In this embodiment, the constant-current formation is carried out is for about 54 minutes, and the constant-voltage formation is carried out for about 25 minutes.

Through this anodizing process, the Ta film is anodized about 260 Å in a direction of depth from its surface, to form an anodized film of Ta$_2$O$_5$ of about 600 Å thickness.

Also, in this anodizing process, at the same time when the Ta$_2$O$_5$ film is formed on the surface of the Ta film, an Al$_2$O$_3$ film of about 700 Å thickness is formed on the surface of the Al film formed on the Ta film. This Al$_2$O$_3$ film will serve as a protective film 38 against an agent such as acid or at the rubbing of an orientation film in later production steps.

In other words, by this anodizing process, it is possible to simultaneously form Ta$_2$O$_5$/Ta film structure (insulating film/first electrode structure), which is a part of the structure of the thin-film two-terminal element, and the protective film 38 for the third metal film 3.

Figure 2D:
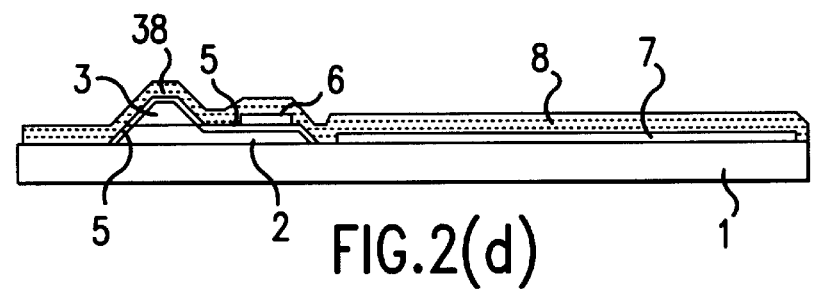

Subsequently, as shown in FIG. 2(d), a Ti film which serves as the second metal film having the function of the second electrode (upper electrode) 6 is formed in a thickness of 1,000Å by an EB deposition method. Film forming conditions at this time are room temperature during the formation of the film (without heating the substrate), a reached vacuum degree of 5×10$^{-6}$ Torr, an acceleration voltage of 4 kV and a film formation current of 120 A. The total stress S of this Ti film is 20.83 N/m from the foregoing formula (1).

Subsequently, the Ti film is patterned into a predetermined configuration by photolithography and etching to form the second electrode 6. It is noted that the patterning for the second electrode 6 here is conducted so that the second electrode 6 is formed on the insulating film 5 thereby to provide the structure of the first electrode interconnect 4/insulating film 5/second electrode 6.

In the above-described manner, the production of the thin-film two-terminal element as shown in FIG. 1(a) is completed.

Figure 4:
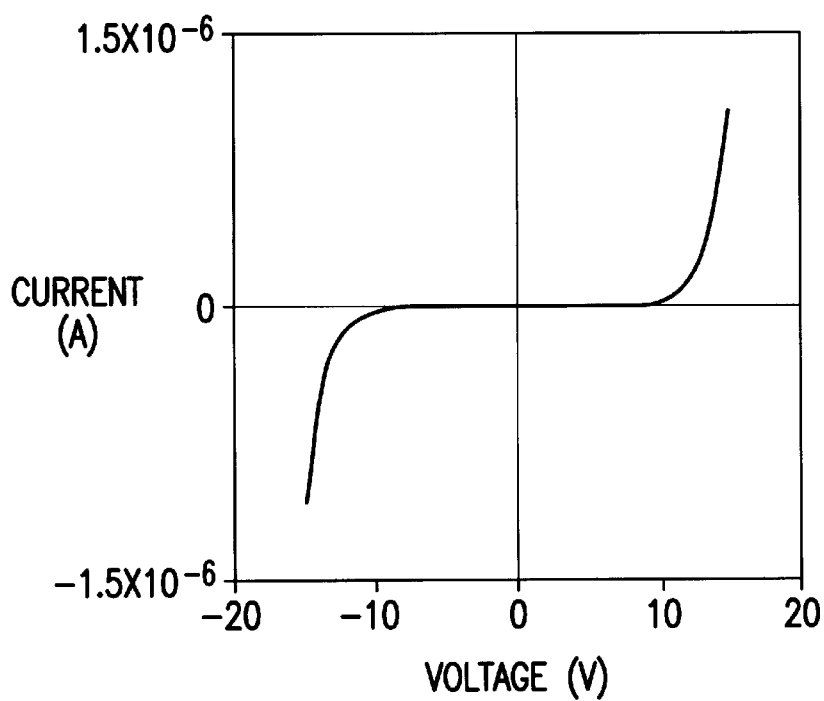
FIG. 4 is a graphical representation showing current-voltage characteristics of a thin-film two-terminal element in accordance with the present invention.

Characteristics of the thus produced thin-film two-terminal element (current (I)–voltage (V) characteristics) are shown in FIG. 4. The characteristics of this thin-film two-terminal element are $\alpha=1.667\times10^{-4}$ and $\beta=3.31$ where the element is a square having an area of 5 $\mu$m.

It is noted that $\alpha$ is a parameter representing the conductivity of the thin-film two-terminal element and $\beta$ is a parameter representing the steepness (magnitude of a change in current with respect to voltage) of the thin-film two-terminal element. They are coefficients of the following theoretical formulae representing Pool-Frenckel conduction, which is a conduction mechanism of the current-voltage characteristics of thin-film two-terminal elements.

$I = V \operatorname{Exp}(\beta\sqrt{V})$ $\alpha = \{n\mu qS \operatorname{Exp}(-\phi/kT)\}/d$ $\beta = \{\sqrt{(q^3)/\pi \in_r \in_0}\}/kT,$ wherein n: carrier concentration, $\mu$: carrier mobility, q: charge amount of electrons, S: area of an element, $\phi$: depth of a trap, k: Boltsmann's constant, T: temperature, d: thickness of the non-linear resistance film, $\in_r$ is specific dielectric constant of the non-linear resistance film and $\in_0$ is dielectric constant in vacuum.

Figure 2E:
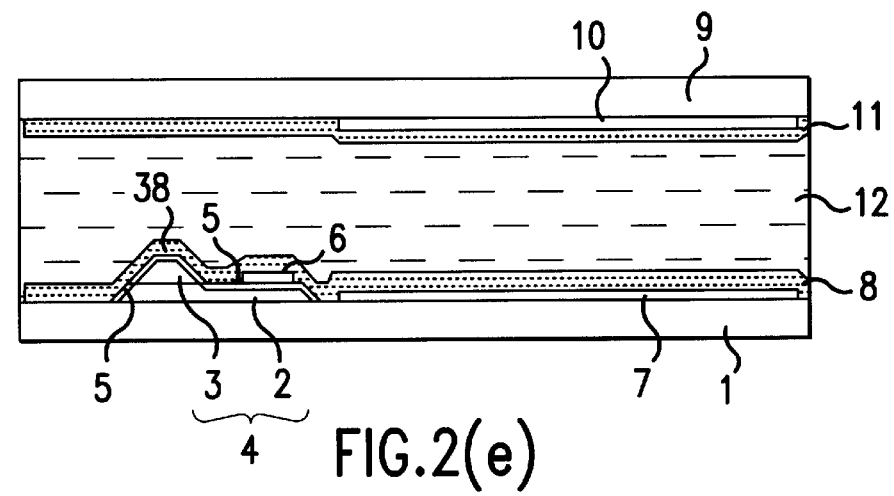

Subsequently, as shown in FIG. 2(e), on the entire surface of the insulative resinous substrate 1 having thin-film two-electrode elements formed thereon as described above, an ITO film is formed in a thickness of 1,000 Å by a sputtering method. The ITO film is patterned into a desired configuration by photolithography and etching thereby to form pixel electrodes 7.

Next, a polyimide film is formed in a thickness of 600 Å by roll coating method so as to cover the entire surface of the resulting insulative resinous substrate 1 and sintered at 150° C. for two hours to form an orientation film 8. Thus the production of an element side substrate 1 is finished.

Subsequently, an insulative transparent resinous substrate 9 of PES is used as an opposite side substrate, and an ITO film is formed in a thickness of 1,000 Å on the entire surface of the substrate 9 by a sputtering method. The ITO film is patterned into a desired configuration by photolithography and etching to provide transparent opposite electrodes 10.

Next, a polyimide film is formed in a thickness of 600 Å by roll coating method so as to cover the entire surface of the resulting insulative resinous substrate 11 and sintered at 150° C. for two hours to form an orientation film 11. Thus the production of the opposite side substrate is finished.

Further, rubbing processing is carried out for orienting the liquid crystal layer 12 to the orientation films 8, 11 of the thus produced element side substrate 1 and opposite side substrate 9. Thereafter, a sealing material (not shown) for bonding is printed on the element side substrate 1 and the opposite side substrate 9, spacers (not shown) are dispersed, and the substrates 1, 9 are bonded together. Liquid crystal is injected between the substrates 1 and 9 to form the liquid crystal layer 12. Thus the production of the liquid crystal display device is completed.

As described above, according to this embodiment, the wiring portion of the thin-film two-terminal element has a sufficiently low resistance, and the stress on the substrate can be reduced as compared with the conventional element. Therefore, a thin-film two-terminal element having satisfactory characteristics can be produced on a resinous substrate.

Also, with use of such thin-film two-terminal elements, it is possible to realize a thin, lightweight liquid crystal display device having excellent impact resistance.

Embodiment 2

Figure 5A:
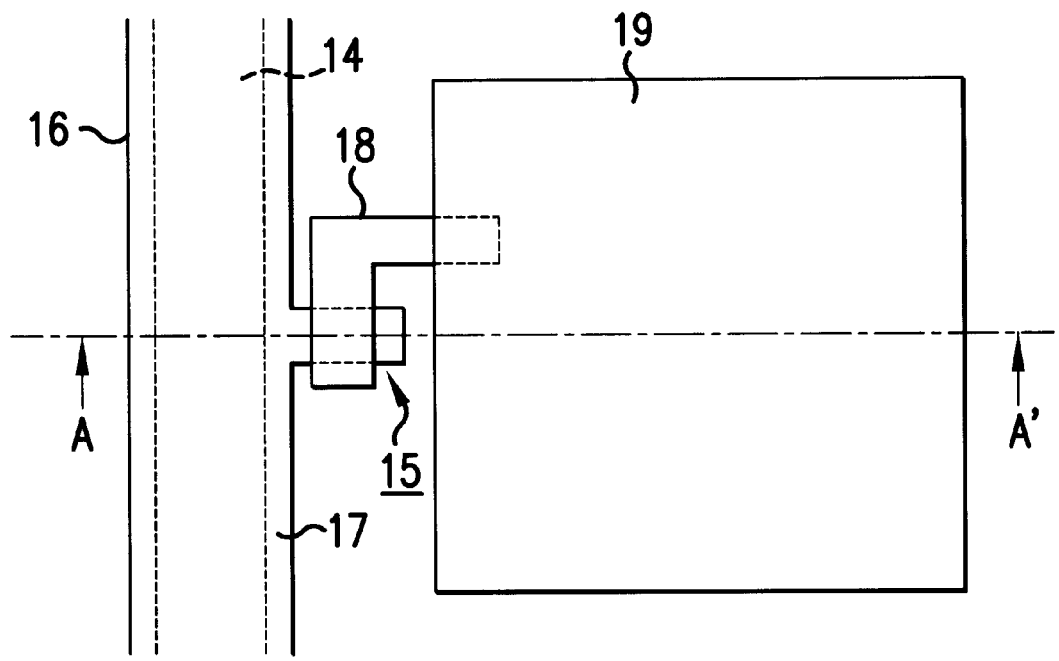
FIG. 5(a) is a schematic plan view of a major part illustrating another embodiment of a thin-film two-terminal element in accordance with the present invention.
Figure 5B:
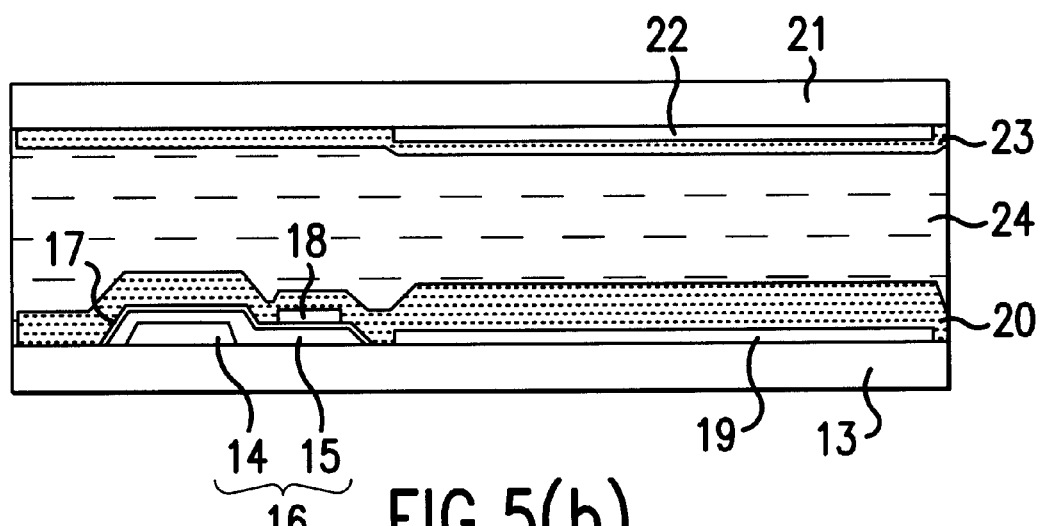
FIG. 5(b) is a schematic sectional view of the major part illustrating a pixel of another liquid crystal display device having the thin-film two-terminal element in accordance with the present invention mounted thereon.

In FIG. 5(a), there is shown a plan view of a major part of a thin-film two-terminal element in one pixel of a liquid crystal display device in accordance with this embodiment. In FIG. 5(b), there is shown a cross-sectional view of the major part taken on line A–A' in FIG. 5(a).

As shown in FIG. 5(a), this thin-film two-terminal element is composed mainly of a first metal film 15 formed on an insulative resinous substrate 13, an insulating film 17 having a non-linear resistance property and a second electrode 18 made of a second metal film.

The first metal film 15 is formed to cover a third metal film 14 formed under its wiring layer. The first metal film 15 and the third metal film 14 are together referred to as a first electrode interconnect 16.

An insulating film 17 is formed on the entire surface of the first metal film 15 so as to cover the first metal film 15, and a second electrode 18 is formed on a first electrode of the first metal film 15 with intervention of the insulating film 17.

Further, as shown in FIG. 5(b), the liquid crystal display device is constructed to be provided with the above-described thin-film two-terminal element per pixel.

That is, in this liquid crystal display device, a pixel electrode 19 is formed on the substrate 13 where the thin-film two-terminal element is not formed. The pixel electrode 19 is connected to the second electrode 18 of the thin-film two-terminal element. Further, an orientation film 20 is formed on the entire surface of the substrate 13 including thin-film two-terminal elements and pixel electrodes 19. An insulative transparent resinous substrate 21 is provided as opposed to the substrate 13. On this substrate 21, transparent opposite electrodes 22 are formed as opposed to the pixel electrodes 19 and an orientation film 23 is formed. Further, a liquid crystal layer 24 is sandwiched between the substrates 13 and 21.

The process of manufacturing the above-described thin-film two-terminal element and liquid crystal device is now explained with reference to FIG. 6.

Figure 6A:
FIGS. 6(a) to 6(f) are schematic sectional views of the major part illustrating a process of manufacturing the thin-film two-terminal element and the liquid crystal display device of FIGS. 5(a) and 5(b)

First, as shown in FIG. 6(a), a PES substrate of 0.4 mm thickness is used as the insulative resinous substrate 13, and an Al film which serves as the third metal film 14 functioning as the wiring layer is formed in a thickness of 100 nm on the insulative resinous substrate 13 by a sputtering method. Film forming conditions at this time are a substrate temperature of 150° C. during the formation of the film, an Ar pressure of 2 Pa and an RF power of 1.7 W/cm².

Subsequently, the Al film is patterned into a predetermined configuration by photolithography and etching to form the third metal film 14.

Figure 6B:
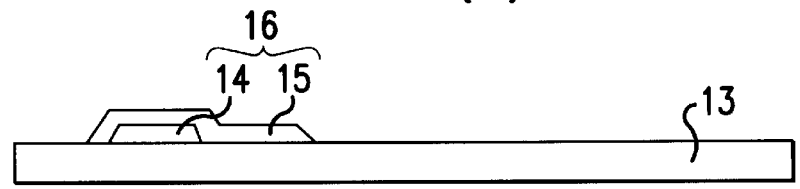

Next, as shown in FIG. 6(b), an Ta film which serves as the first metal film 15 is formed in a thickness of 100 nm so as to cover the third metal film 14 by a sputtering method. Film forming conditions at this time are a substrate temperature of 150° C. during the formation of the film, an Ar pressure of 0.5 Pa and an RF power of 3.4 W/cm².

Subsequently, the Ta film is patterned into a predetermined configuration by photolithography and etching to form the first metal film 15. It is noted that here the first electrode interconnect 16 having the functions of the wiring layer and the first electrode is formed of the first metal film 15 which completely covers the third metal film 14.

Here, the stress of the first electrode interconnect 16 is the same as that in Embodiment 1, and has only a small influence on the substrate.

Figure 6C:

Next, as shown in FIG. 6(c), an anodized film of $Ta_2O_5$ which serves as the insulating film 17 of the thin-film two-terminal element is formed in a thickness of about 600 Å on the surface of the Ta film by the same anodizing process as described in Embodiment 1.

It is noted that the Al film which is the third metal film 14 is not oxidized by this anodizing process because it is completely covered with the first metal film 15.

Figure 6D:

Subsequently, as shown in FIG. 6(d), a Ti film is formed as the second metal film having the function of the second electrode (upper electrode) 18 in the same manner as described in Embodiment 1. The total stress S of this Ti film is 20.83 N/m as in Embodiment 1.

Next, the Ti film is patterned into a predetermined configuration to form the second electrode 18 on the insulating film 17 in the same manner as described in Embodiment 1. Thereby the structure of the first electrode interconnect 16/insulating film 17/second electrode 18 is formed.

The characteristics of the thus produced thin-film two-terminal element are the same as those of the element of Embodiment 1.

Figure 6E:
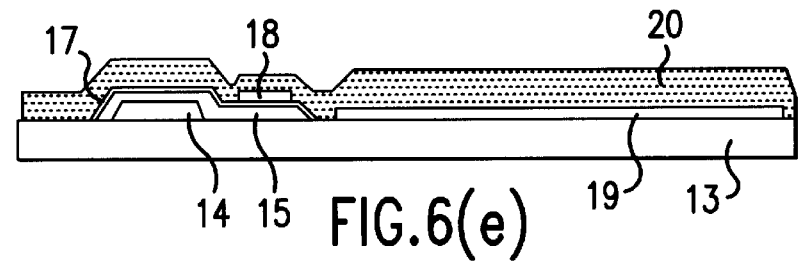

Subsequently, as shown in FIG. 6(e), on the entire surface of the substrate 13 having thin-film two-electrode elements formed thereon as described above, formed are pixel electrodes 19 and an orientation film 20 in the same manner as described in Embodiment 1. Thus the production of an element side substrate 13 is finished.

Figure 6F:
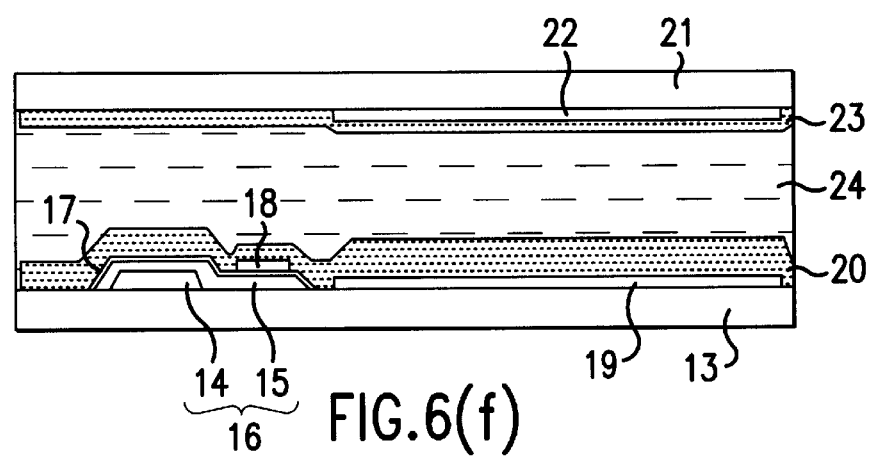

Next, as shown in FIG. 6(f), an insulative transparent resinous substrate 21 of PES is used as an opposite side substrate, and transparent opposite electrodes 22 are formed on the substrate 21 in the same manner as in Embodiment 1.

Subsequently, an orientation film 23 is formed to cover the entire surface of the resulting substrate 21 in the same manner as described in Embodiment 1. Thus the production of the opposite side substrate is finished.

Next, liquid crystal is injected between the thus produced element side substrate and opposite side substrate 13 and 21 to form a liquid crystal layer 24 in the same manner as in Embodiment 1. Thus the production of the liquid crystal display device is completed.

As described above, according to this embodiment, the wiring portion of the thin-film two-terminal element has a sufficiently low resistance, and the stress on the substrate can be reduced as compared with the conventional element. Therefore, a thin-film two-terminal element having excellent characteristics can be produced.

Therefore, with use of such thin-film two-terminal elements, it is possible to realize a thin, lightweight liquid crystal display device having excellent impact resistance.

Embodiment 3

Figure 7A:
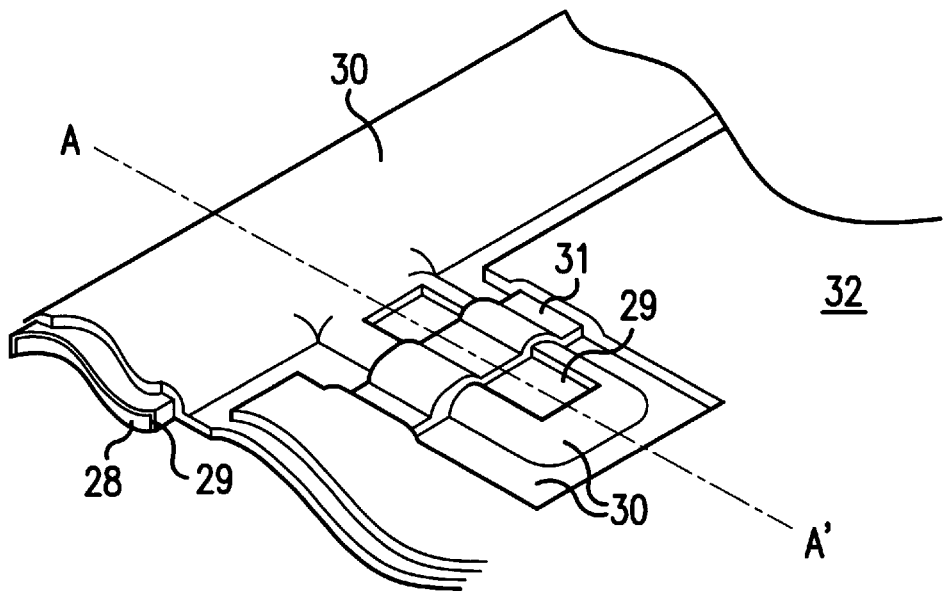
FIGS. 7(a) is a schematic perspective view of a major part illustrating another embodiment of a thin-film two-terminal element in accordance with the present invention.
Figure 7B:
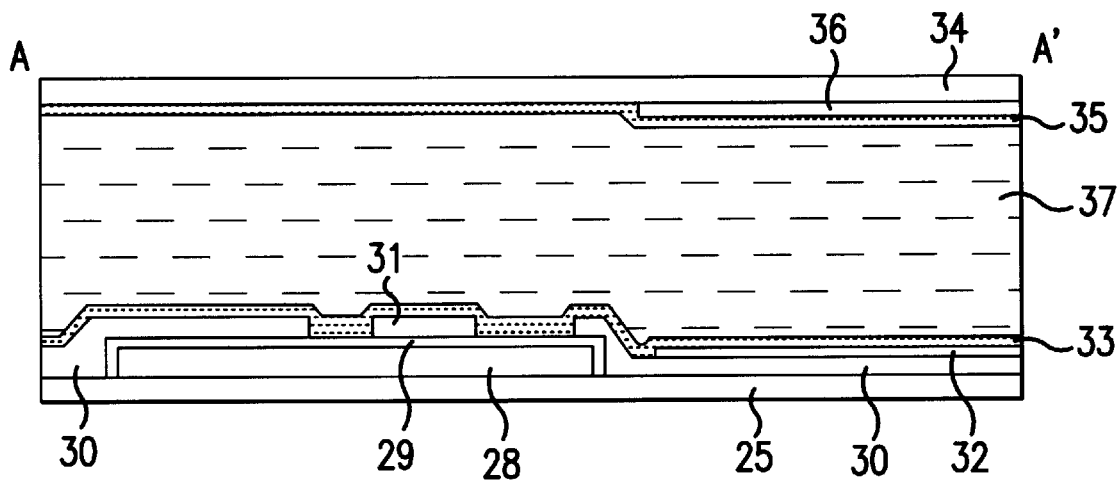
FIG. 7(b) is a schematic sectional view of the major part illustrating a pixel of another liquid crystal display device having the thin-film two-terminal element in accordance with the present invention mounted thereon.

In FIG. 7(a), there is shown a perspective view of a major part of a thin-film two-terminal element in one pixel of a liquid crystal display device in accordance with this embodiment. In FIG. 7(b), there is shown a cross-sectional view of the major part taken on line A–A' in FIG. 7(a).

As shown in FIG. 7(a), this thin-film two-terminal element is composed mainly of a first electrode interconnect 28 comprised of a first metal film 26 which is formed on an insulative resinous substrate 25 and functions as a wiring layer and a first electrode, an insulating film 29 having a non-linear resistance property and a second electrode 31.

The insulating film 29 is formed to cover the first metal film 26, and a second insulating film 30 is formed on the entire surface of the substrate 25 so as to cover end portions of the first metal film 26 except a portion on the first metal film 26 which is covered with the insulating film 29. Further, the second electrode 31 is formed to extend from the top of the second insulating film 30 to the top of the insulating film 29 where the second insulating film 30 is not formed.

Further, as shown in FIG. 7(b), the liquid crystal display device is constructed to be provided with the above-described thin-film two-terminal element per pixel.

That is, in this liquid crystal display device, a pixel electrode 32 is formed on the second insulating film 30 where the thin-film two-terminal element is not formed, and on the substrate 25. The pixel electrode 32 is connected to the second electrode 31 on the second insulating film 30. Further, an orientation film 33 is formed on the entire surface of the substrate 25 including thin-film two-terminal elements and pixel electrodes 32. Also an insulative transparent resinous substrate 34 is provided as opposed to the substrate 25. On this substrate 34, transparent opposite electrodes 36 are formed as opposed to the pixel electrodes 32 and an orientation film 35 is formed. A liquid crystal layer 37 is sandwiched between the substrates 25 and 34.

The process of manufacturing the above-described thin-film two-terminal element and liquid crystal devices is now explained with reference to FIG. 8.

Figure 8A:
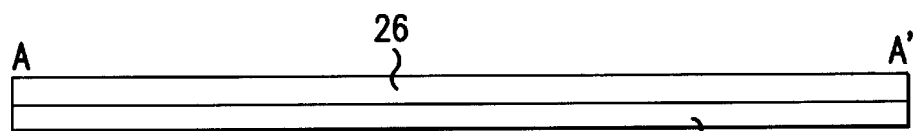
FIGS. 8(a) to 8(f) are schematic sectional views of the major part illustrating a process of manufacturing the thin-film two-terminal element and the liquid crystal display device of FIGS. 7(a) and 7(b)

First, as shown in FIG. 8(a), a PES substrate of 0.4 mm thickness is used as the insulative resinous substrate 25, and an Ta film which serves as the first metal film 26 is formed in a thickness of 100 nm on the substrate 25 by a sputtering method. Film forming conditions at this time are a substrate temperature of 150° C. during the formation of the film, an Ar pressure of 0.5 Pa and an RF power of 3.4 W/cm$^2$. The total stress S of the Ta film on the substrate is S=765 N/m (compression stress) from the foregoing formula (1).

Figure 8B:
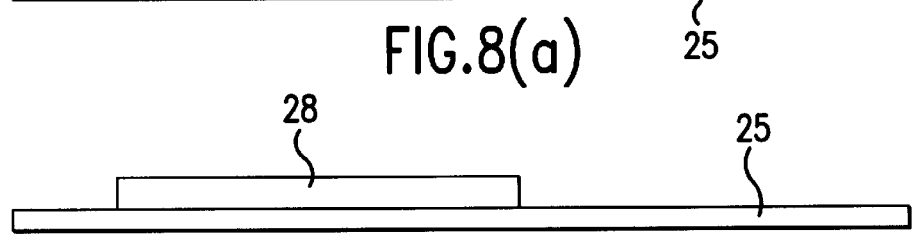

Subsequently, as shown in FIG. 8(b), the Ta film is patterned into a predetermined configuration by photolithography and etching, thereby to form the first electrode interconnect 28 functioning as the wiring layer and the first electrode in a predetermined position on the substrate 25.

Figure 8C:
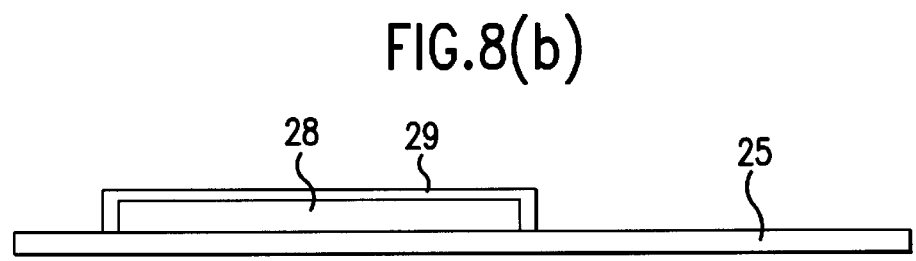

Next, as shown in FIG. 8(c), an anodized film of $Ta_2O_5$ of about 600 Å thickness is formed as the insulating film 29 on the surface of the first electrode interconnect 28 by the same anodizing process as described in Embodiment 1.

Next, a $SiO_2$ film which is the second insulating film 30 is formed in a thickness of 100 nm by a sputtering method on the entire surface of the substrate 25 including the first electrode interconnect 28 having the insulating film 29 formed thereon. Film forming conditions at this time are a film forming temperature of 150° C., an Ar pressure of 2 Pa and an RF power of 1.7 W/cm$^2$. It is noted that a material for composing the second insulating film 30 is required to have insulation properties while at the same time having the function of preventing release of gas comprised of gas molecules or liquid molecules from the resinous substrate. The inventors' study has revealed that the film is required to have denseness to some extent in order to satisfy the insulation properties and a gasbarrier property at the same time. For example, the gas-barrier properties was not observed in an $SiO_2$ film formed by an ordinary EB deposition method which did not involve the heating of substrates. In this connection, since the film is formed on a resinous substrate, the heating of the substrate during the formation of the film is limited. Preferably the film forming temperature is about 150° C.

Figure 8D:
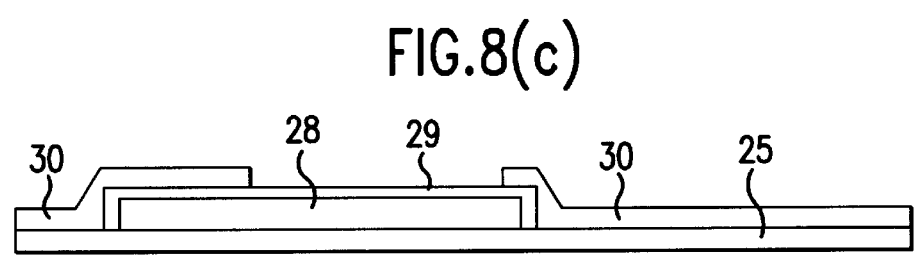

Subsequently, as shown in FIG. 8(d), the $SiO_2$ film is patterned into a predetermined configuration by photolithography and etching to form an opening in the second insulating film 30 in the center on the first electrode interconnect 28.

Next, a Ti film having the function of the second electrode (upper electrode) 31 is formed in a thickness of 100 nm by an EB deposition method. Film forming conditions at this time are room temperature for the formation of the film (without heating the substrate), a reached vacuum degree of $5\times10^{-6}$ Torr, an acceleration voltage of 4 kV and a film formation current of 120 A. The total stress S of this Ti film is S=20.83 N/m from the foregoing formula (1).

Figure 8E:
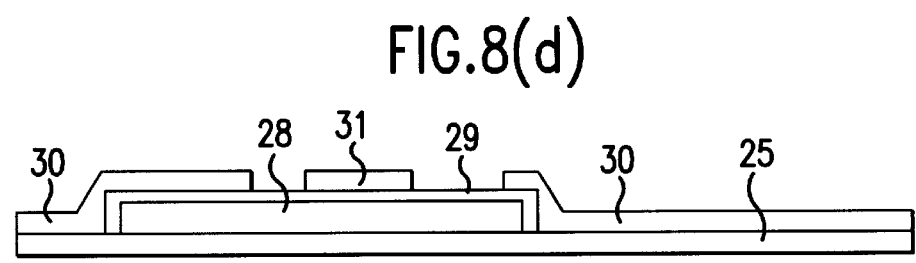
Figure 8F:
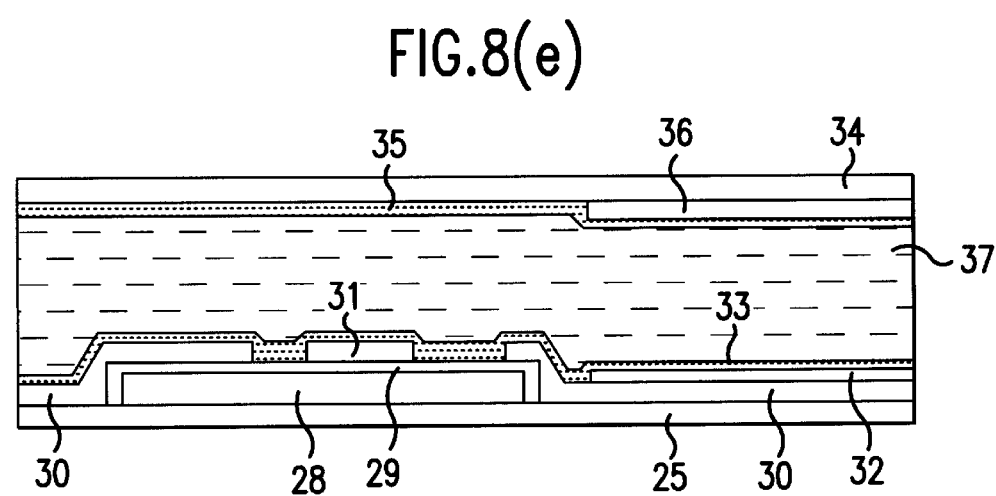

Subsequently, as shown in FIG. 8(e), the Ti film is patterned into a predetermined configuration by photolithography and etching to form the second electrode 31. It is noted that the patterning for the second electrode 31 is carried out through the opening formed in the second insulating film 30 on the first electrode interconnect 28 so as to provide the structure of the first electrode interconnect 28/insulating film 29/second electrode 31.

In the above-described manner, the production of the thin-film two-electrode element as shown in FIG. 7(a) is completed.

The characteristics of the thus produced thin-film two-terminal element are the same as those of the element of Embodiment 1.

Explanation is now given of the effect of the second insulating film 30 in the thus produced thin-film two-electrode element.

The second insulating film 30 is formed to cover edge portions of the first electrode interconnect 28 composing the thin-film two-terminal electrode and can maintain insulation between the second electrode 31 and the first electrode interconnect 28 in portions other than the thin-film two-electrode element formed in the opening in the second insulating film 30. That eliminates influence of leakage current flowing between the first electrode interconnect 28 and the second electrode 31 in the portions other than the thin-film two-terminal element portion and allows obtainment of thin-film two-terminal elements composed only of the first electrode interconnect 28/insulating film 29/second electrode 31 which are constructed in a predetermined area as defined by the opening in the second insulating film 30.

Further, since the second insulating film 30 is disposed to be sandwiched between the insulative resinous substrate 25 and the second electrode 31 and covers the entire surface of the substrate 25, the second insulating film has an effect in cutting off gas released from the substrate 25 when the second electrode 31 is formed. That allows the metal film to be prevented from changing in quality by taking in the gas released from the substrate 25 during the formation of the second electrode 31.

Moreover, since the second insulating film 30 can reduce level difference at the first electrode interconnect 28, it is possible to avoid breaking of wiring for the second electrode 31 at such step portions.

In addition, in the case where the Ti film serving as the second electrode 31 was formed directly on the resinous substrate 25 without using the second insulating film 30, it was observed the Ti film discolors by taking in gas released from the substrate 25. Further, in the process of patterning this Ti film in a predetermined configuration, etching defects occurred due to change in quality of the film and it was difficult to pattern it in the predetermined configuration.

Subsequently, as shown in FIG. 8(*f*), on the entire surface of the insulative resinous substrate 25 having thin-film two-electrode elements formed thereon as described above, formed are pixel electrodes 32 and an orientation film 33 in the same manner as described in Embodiment 1. Thus, the production of an element side substrate 1 is completed.

Subsequently, formed is an opposite side substrate which has transparent opposite electrodes 36 and an orientation film 35 on the surface an insulative transparent resinous substrate 34, in the same manner as described in Embodiment 1.

Further, the substrates 25 and 34 are bonded together and liquid crystal is injected between the substrates 25 and 34 to form a liquid crystal layer 37 in the same manner as described in Embodiment 1. Thus the production of a liquid crystal display device is completed.

Thus, according to this embodiment, the provision of the insulating film for cutting off gas release from the resinous substrate can prevent changes in quality of the metal film and at the same time reduce leakage current regarding the thin-film two-terminal element. Therefore, a thin-film two-terminal element having excellent characteristics can be produced.

Also, with use of such thin-film two-terminal elements, it is possible to realize a thin, lightweight liquid crystal display device having excellent impact resistance.

Embodiment 4

Figure 9A:
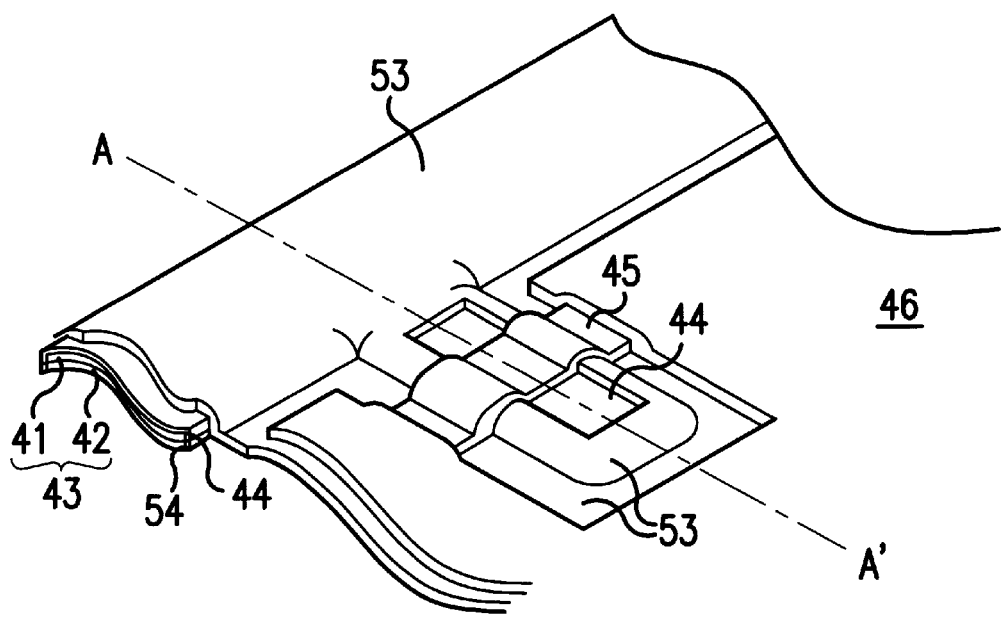
FIGS. 9(a) is a schematic perspective view of a major part illustrating still another embodiment of a thin-film two-terminal element in accordance with the present invention.
Figure 9B:
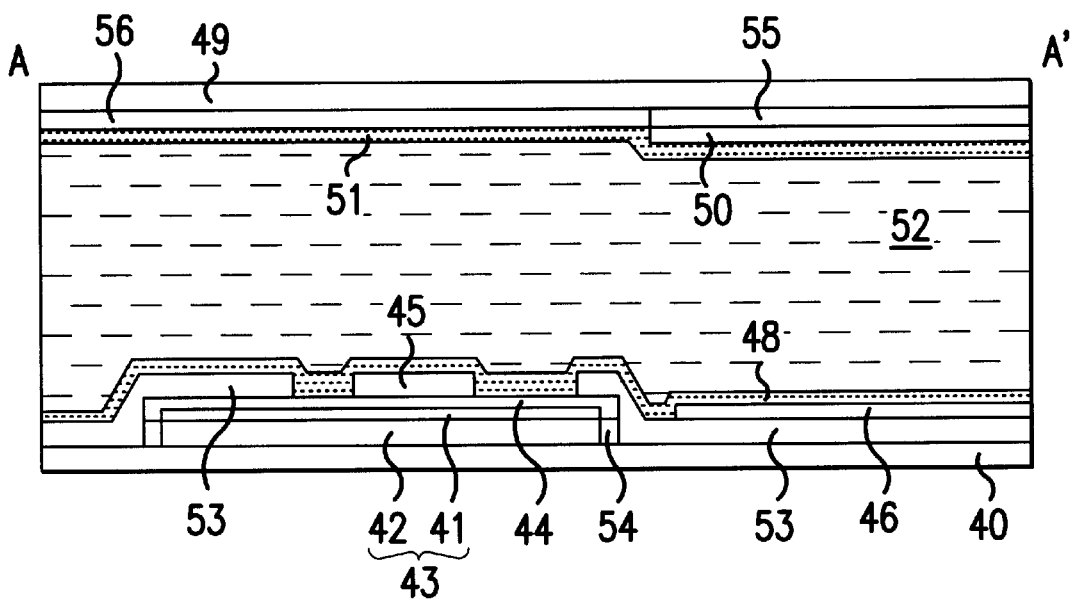
FIG. 9(b) is a schematic sectional view of the major part illustrating a pixel of another liquid crystal display device having the thin-film two-terminal element in accordance with the present invention mounted thereon.

In FIG. 9(*a*), there is shown a perspective view of a major part of a thin-film two-terminal element in one pixel of a liquid crystal display device in accordance with this embodiment. In FIG. 9(*b*), there is shown a cross-sectional view of the major part taken on line A–A' in FIG. 9(*a*).

As shown in FIG. 9(*a*), this thin-film two-terminal element is composed mainly of a first electrode interconnect 43 which is formed on an insulative resinous substrate 40, functions as a wiring layer and a first electrode and is comprised of a laminate of a first metal film 41 and a third metal film 42, an insulating film 44 having a non-linear resistance property and a second electrode 45.

The insulating film 44 is formed to cover the first metal film 41, and a protective film 54 is formed on sides of the third metal film 42. Further, a second insulating film 53 is formed on the substrate 40 so as to cover edge portions of the first metal film 41 except a portion on the first metal film 41 which is covered with the insulating film 44. The second electrode 45 is formed to extend from the top of the second insulating film 53 to the top of the insulating film 44 where the second insulating film 53 is not formed. In this connection, the second insulating film 53 prevents the protective film 54 for the third metal film 42 from contacting the second electrode 45 and thus maintains insulation.

Also, as shown in FIG. 9(*b*), the liquid crystal display device is constructed to be provided with the above-described thin-film two-terminal element per pixel.

That is, in this liquid crystal display device, the first electrode of the thin-film two-terminal element in each pixel is formed as a first electrode interconnect 43 which functions as a wiring layer. Further, a pixel electrode 46 is formed on the second insulating film 53 where the thin-film two-terminal element is not formed on the substrate 25. The pixel electrode 46 is connected to the second electrode 45 on the second insulating film 53. Further, an orientation film 48 is formed on the entire surface of the substrate 40 including thin-film two-terminal elements and pixel electrodes 46. Also, an insulative transparent resinous substrate 49 is provided as opposed to the substrate 40. On this substrate 49, transparent opposite electrodes 50 and color filters 55 are formed as opposed to the pixel electrodes 46, and a black matrix 56 is formed as opposed to the thin-film two-terminal elements. An orientation film 51 is formed on the entire surface of the transparent opposite electrodes 50 and the black matrix 56. Further, a liquid crystal layer 52 is sandwiched between the substrates 40 and 49.

The process of manufacturing the above-described thin-film two-terminal element and the liquid crystal device is now explained with reference to FIG. 10.

First, as shown in FIG. 10(*a*), a PES substrate of 0.4 mm thickness is used as the insulative resinous substrate 40, and an Al film which serves as the third metal film 42 is formed in a thickness of 150 nm on the insulative resinous substrate 40 by a sputtering method. Film forming conditions at this time are a substrate temperature of 150° C. during the formation of the film, an Ar pressure of 2 Pa and an RF power of 1.7 W/cm$^2$.

Subsequently, a Ta film which serves as the first metal film 41 is formed in a thickness of 100 nm on the third metal film 42 by a sputtering method. Film forming conditions at this time are a substrate temperature of 150° C. during the formation of the film, an Ar pressure of 0.5 Pa and an RF power of 3.4 W/cm$^2$.

Now explanation is given of the stress of the Al film. Al films have much smaller stress as compared with Ta films. In this embodiment, calculation of the total stress S according to the aforementioned formula (1) gives S=30.58 N/m (compression stress), which is much smaller than that of the Ta film. The substrate is less affected.

Figure 11:
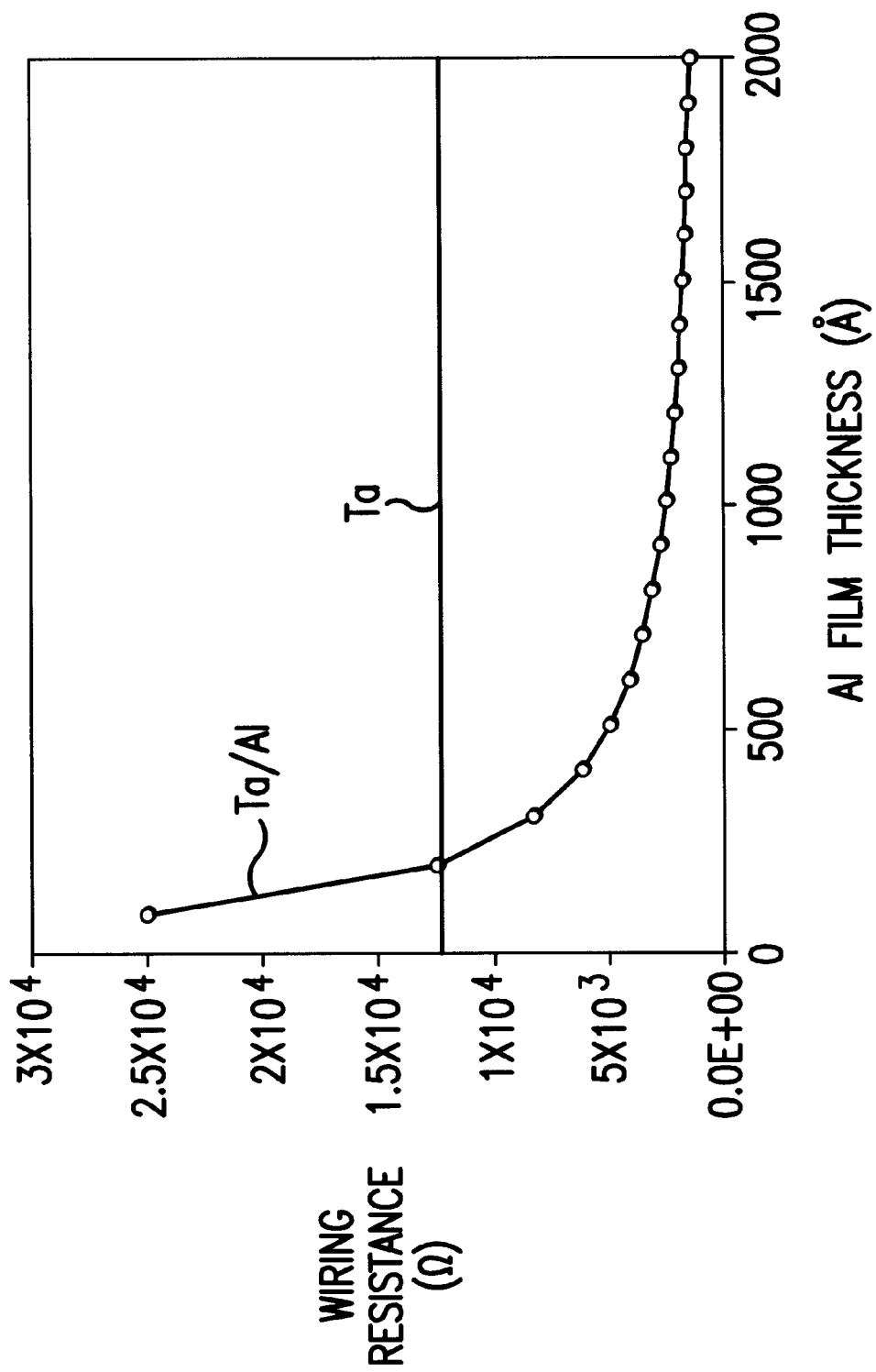
FIG. 11 is a graphical representation showing a relationship of wiring resistance to the thickness of an Al film.

FIG. 11 shows a relationship between the thickness of an Al film and wiring resistance. The resistivity of the Al film, ρ=2.5 Ωm, is much smaller than the resistivity of an Ta film, ρ=12.3 Ωm. With use of an Al film for wiring, a Ta/Al film of 20 μm interconnect-width and 10 cm interconnect-length realizes about half the wiring resistance of a Ta film of 100 nm thickness in the case where the Al film is 40 nm thick and about one-seventh of the wiring resistance in the case where the Al film is 150 nm thick.

Subsequently, as shown in FIG. 10(b), the first and third metal films 41 and 42 are patterned into a predetermined configuration by photolithography and etching, thereby to form the first electrode interconnect 43 having the functions of the wiring layer and the first electrode.

Next, as shown in FIG. 10(c), an anodized film of $Ta_2O_5$ which serves as the insulating film 44 of the thin-film two-electrode element is formed on the surface of the first metal film 41 by the same anodizing process as described in Embodiment 1. This $Ta_2O_5$ film has a thickness of about 600 Å. At this time, sides of the third metal film 42 are simultaneously anodized to form a protective film 54 of $Al_2O_3$ having a thickness of about 700 Å.

Thus, by combination of the first electrode interconnect 43 and the anodized film, it becomes possible to simultaneously form the structure of the $Ta_2O_5$ film/Ta film, which serves as a part of the constitution of the thin-film two-terminal electrode, and the protective film 54 for the third metal film 42.

Next, a $SiO_2$ film which serves as the second insulating film 53 is formed on the entire surface of the substrate 40 in the same manner as described in Embodiment 1. As shown in FIG. 10(d), the $SiO_2$ film is patterned into a predetermined configuration by photolithography and etching so as to form an opening in the center on the first electrode interconnect 43.

Subsequently, a Ti film is formed as a second metal film having the function of the second electrode (upper electrode) 45 in the same manner as described in Embodiment 1. The total stress S of this Ti film is S=20.83 N/m as in Embodiment 1.

Next, as shown in FIG. 10(e), the Ti film is patterned in the same manner as described in Embodiment 1 so as to form the structure of the first electrode interconnect 43/insulating film 44/second electrode 45 via the opening in the second insulating film 53 formed on the first electrode interconnect 43.

The characteristics of the thus produced thin-film two-terminal element are the same as those of Embodiment 1.

Subsequently, as shown in FIG. 10(f), on the entire surface of the substrate 40 having thin-film two-electrode elements formed thereon as described above, pixel electrode 46 and an orientation film 48 are formed in the same manner as described in Embodiment 1. Thus, the production of an element side substrate 40 is finished.

Subsequently, an insulative transparent resinous substrate 49 of PES is used as an opposite side substrate. Color filters 55 and a black matrix 56 are formed in portions opposing the pixel electrodes 46 and in portions opposing the thin-film two-terminal elements, respectively. Further, transparent opposite electrodes 50 are formed on the color filters 55 in the same manner as described in Embodiment 1. Also, an orientation film 51 is formed on the resulting substrate 49 in the same manner as described in Embodiment 1. Thus the production of the opposite side substrate 49 is finished. As described in Embodiment 1, liquid crystal is injected between the substrates 40 and 49 to form a liquid crystal layer 52. Thus the production of the liquid crystal device is completed.

As described above, according to this embodiment, it is possible to sufficiently reduce the resistance in a wiring portion of the thin-film two-terminal element and also to decrease the stress on the substrate as compared with the conventional element.

Also, by providing the second insulating film which cuts off gas release from the substrate, it is possible to realize a structure which prevents changes in quality of the metal film while at the same time reducing leakage current regarding the thin-film two-terminal element and to produce a thin-film two-terminal element having excellent characteristics.

Therefore, with use of such thin-film two-terminal elements, it is possible to realize a thin, lightweight liquid crystal display device having excellent impact resistance.

Embodiment 5

Figure 12A:
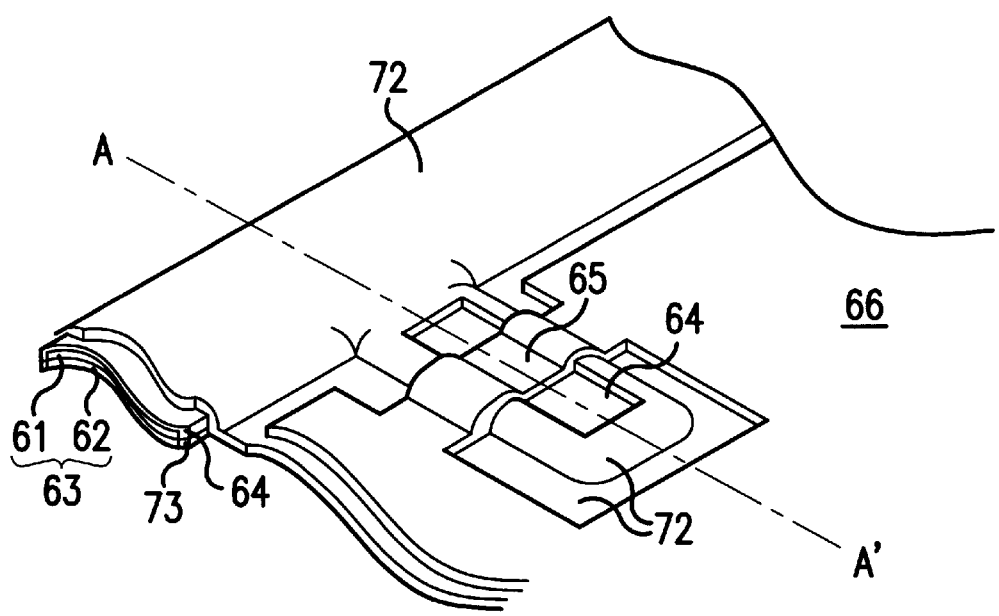
FIGS. 12(a) is a schematic perspective view of a major part illustrating still another embodiment of a thin-film two-terminal element in accordance with the present invention.
Figure 12B:
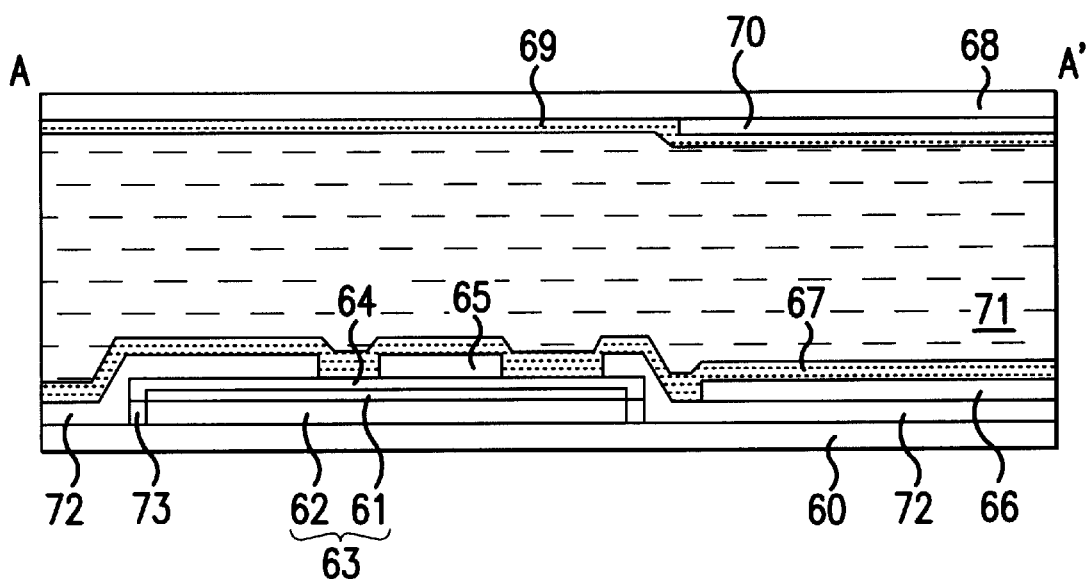
FIG. 12(b) is a schematic sectional view of the major part illustrating a pixel of another liquid crystal display device having the thin-film two-terminal element in accordance with the present invention mounted thereon.

In FIG. 12(a), there is shown a perspective view of a major part of a thin-film two-terminal element in one pixel of a liquid crystal display device in accordance with this embodiment. In FIG. 12(b), there is shown a cross-sectional view of the major part taken on line A–A' in FIG. 12(a).

As shown in FIG. 12(a), this thin-film two-terminal element is composed mainly of a first electrode interconnect 63 which is formed on an insulative resinous substrate 60, functions as a wiring layer and a first electrode and is comprised of a laminate of a first metal film 61 and a third metal film 62, an insulating film 64 having a non-linear resistance property and a second electrode 65.

The insulating film 64 is formed to cover the first metal film 61, and a protective film 73 is formed on sides of the third metal film 62. Further, a second insulating film 72 is formed on the entire surface of the substrate 60 so as to cover edge portions of the first metal film 61 except a portion on the first metal film 61 which is covered with the insulating film 64. The second electrode 65 is formed to extend from the top of the second insulating film 72 to the top of the insulating film 64 where the second insulating film 72 is not formed. It is noted that, the second insulating film 72 prevents the protective film 73 for the third metal film 62 form contacting the second electrode 65 and maintains insulation, so that leakage from this portion can be prevented.

Further, as shown in FIG. 12(b), the liquid crystal display device is constructed to be provided with the above-described thin-film two-terminal element per pixel.

That is, in this liquid crystal display device, the first electrode of the thin-film two-terminal element in each pixel is formed as the first electrode interconnect 63 which functions as a wiring layer. Further, a reflection pixel electrode 66 is formed integrally with the above-mentioned second electrode 65 on the second insulating film 72 where the thin-film two-terminal element is not formed on the substrate 60. Also an orientation film is formed on the entire surface of the substrate 60 including thin-film two-terminal elements and reflection pixel electrodes 66. An insulative transparent resinous substrate 68 is provided as opposed to the substrate 60. On this substrate 68, transparent opposite electrodes 70 are formed as opposed to the reflection pixel electrodes 66 and an orientation film 69 is formed on the entire surface of the substrate 68. Further, a liquid crystal layer 71 is sandwiched between the substrates 60 and 68.

The process of producing the above-described thin-film two-terminal element and liquid crystal display device is now explained with reference to FIG. 13.

First, as shown in FIG. 13(a), a PES substrate of 0.4 mm thickness is used as the insulative resinous substrate 40, and an Al film which serves as the third metal film 62 and a Ta film which serves as the first metal film 61 are formed on the insulative resinous substrate 40 in the same manner as described in Example 4. It is noted that the stress and resistance of the Al film are the same as those in Embodiment 4. Accordingly, the influence of the stress on the substrate is small and the wiring resistance can be reduced.

Subsequently, as shown in FIG. 13(b), the first and third metal films 61 and 62 are patterned in the same manner as described in Embodiment 4 to from a first electrode interconnect 63 having the functions of the wiring layer and the first electrode.

Next, as shown in FIG. 13(c), an anodized film of $Ta_2O_5$ which serves as the insulating film 64 of the thin-film two-terminal element having a non-linear resistance property and a protective film 73 are formed by the same anodizing process as described in Embodiment 4.

Next, a $SiO_2$ film which serves as the second insulating film 72 is formed on the entire surface of the substrate 1 in the same manner as described in Embodiment 4, and as shown in FIG. 13(d), the $SiO_2$ film is patterned into a predetermined configuration by photolithography and etching, to form an opening in the center on the first electrode interconnect 63.

Subsequently, an Al film of 150 nm thickness is formed as the second electrode (upper electrode) 65 and the reflection pixel electrode 66 by a sputtering method. Film forming conditions at this time are a substrate temperature of 150° C. during the formation of the film, an Ar pressure of 2 Pa and an RF power of 1.7 W/cm$^2$.

Next, as shown in FIG. 13(e), the Al film is patterned into a desired configuration to form the structure of the first electrode interconnect 63/insulating film 64/second electrode 65 via the opening in the second insulating film 72 formed on the first electrode interconnect 63, while at the same time forming the reflection pixel electrode 66 integrally with the second electrode 65 on the second insulating film 72 formed on the substrate 60.

The characteristics of the thus produced thin-film two-terminal element are substantially the same as those of Embodiments 1 to 4.

Subsequently, as shown in FIG. 13(f), on the entire surface of the resulting substrate 60 having thin-film two-terminal elements formed thereon as described above, an orientation film 67 is formed in the same manner as described in Embodiment 1. Thus the production of an element side substrate 60 is finished.

Subsequently, an insulative transparent substrate 68 of PES is used as an opposite side substrate, and transparent opposite electrodes 70 and an orientation film 69 are formed in the same manner as described in Embodiment 1. Thus the production of the opposite side substrate 68 is finished. As described in Embodiment 1, liquid crystal is injected between the substrate 60 and 68 to from a liquid crystal layer 71. Thus the production of the liquid crystal display device is completed.

As described above, according to this embodiment, it is possible to sufficiently reduce the resistance in a wiring portion of the thin-film two-terminal element and also to decrease the stress on the substrate as compared with the conventional element.

Also, by providing the second insulating film which cuts off gas release from the substrate, it is possible to realize a structure which prevents changes in quality of the metal film while at the same time reducing leakage current regarding the thin-film two-terminal element and to produce a thin-film two-terminal element having excellent characteristics.

Therefore, with use of such thin-film two-terminal elements, it is possible to realize a thin, lightweight liquid crystal display device having excellent impact resistance.

INDUSTRIAL APPLICABILITY

According to the preset invention, the thin-film two-electrode element is constituted on an insulative substrate by laminating a first metal film functioning as a wiring layer and a first electrode, a first insulating film which has a non-linear resistance property and is formed on the first electrode of the first metal film, and a second metal layer functioning as a second electrode, and a third metal film which has a smaller stress and resistance than the first metal film is formed at least in a wiring layer portion of the first metal film. Accordingly, it is possible to reduce the stress on the insulative substrate by the first metal film which has a high stress and to prevent the substrate from deforming and the first metal film from exfoliating. Therefore, the kind of the insulative substrate is not limited. Moreover, whatever insulative substrate may be used, it is possible to realize a thin-film two-terminal element of high quality having an insulating film of non-linear resistance property and low-resistance electrode wiring.

Further, in the case where the first insulating film is formed by anodizing the first metal film, adhesion strength can be ensured at the interface between the first metal film and the first insulating film. Therefore, inconveniences such as exfoliation can be prevented.

Further, in the case where a protective film is formed on the surface of the third metal film, it is possible to improve acid resistance and chemical resistance in the production process of mounting the obtained thin-film two-terminal element on a liquid crystal display device and also it is possible to utilize the protective film as a protective film during rubbing processing of an orientation film.

Also, according to the present invention, the production process includes the steps of forming a first metal film functioning as a wiring layer and a first electrode on an insulative substrate, forming a third metal film having a smaller stress and a smaller resistance than the first metal film at least in a wiring layer portion of the first metal film, forming a first insulating film having a non-linear resistance property on the first electrode of the first metal film and forming a second metal film functioning as a second electrode on the first insulating film. Accordingly, it is possible to reduce the stress on the insulative substrate by the first metal film which has a high stress and to prevent the substrate from deforming and the first metal film from exfoliating. Therefore, the kind of the insulative substrate is not limited. Moreover, whatever insulative substrate may be used, it is possible to produce a thin-film two-terminal element of high quality having an insulating film of non-linear resistance property and low-resistance electrode wiring.

Further, in the case where a protective film is formed on the surface of the third metal film at the same time as the step of forming the first insulating film by anodizing the first metal film, it is possible to simplify formation process.

Also, according to the present invention, it is possible to realize a liquid crystal display device provided with thin-film two-terminal elements whose substrate is less susceptible to deformation, whose electrodes are less liable to exfoliation and which has low-resistance electrode interconnects, whatever kind of substrate may be used.

Furthermore, according to the present invention, the thin-film two-electrode element is constituted on an insulative substrate by laminating a first metal film functioning as a wiring layer and a first electrode, a first insulating film having a non-linear resistance property and a second metal layer functioning as a second electrode and a second insulating film is formed at least under the second metal film except a portion thereof electrically functioning with the first electrode via the first insulating film. Accordingly, it is possible to cut off gas molecules and liquid molecules generated from the insulative substrate and/or passing through the insulative substrate and prevent denaturation or deterioration of the second electrode caused by such gas molecules and liquid molecules and at the same time to prevent occurrence of leakage current in that portion. Therefore, it is possible to produce a thin-film two-terminal element excellent in characteristics.

The above-mentioned effect is remarkable especially in the case where the second insulating film has the function of cutting off gas molecules and/or liquid molecules generated from and/or passing through the insulative substrate and the function of enhancing electrical insulation under the second electrode except a region thereof which electrically functions with the first electrode via the insulating film having the non-linear resistance property.

Also, in the case where the first insulating film having the non-linear resistance property is formed by anodization, inconveniences such as poor adhesion strength and the like do not occur at the interface between the first electrode and the non-linear resistance film. In this respect, it is also possible to provide a thin-film two-terminal element having excellent characteristics.

Further, in the case where at least a wiring layer portion of the first metal film is constituted of a laminate with the third metal film which produces a smaller stress with the insulative substrate and a smaller electrical resistance than the first metal film, it is possible to provide an interconnect having a good close contact property and a sufficiently low electrical resistance. In this respect, it is also possible to provide a thin-film two-terminal element having excellent characteristics.

Also, in the case where the insulative substrate is formed of a resinous substrate, a thin, lightweight thin-film two-terminal element excellent in impact resistance can be provided. It is possible to provide a thinner liquid crystal display device which is lighter in weight and has more excellent impact resistance, by equipping it with such thin-film two-terminal elements.

Further, according to the process for producing a thin-film two-terminal element of the present invention, it is possible to easily form a thin-film two-terminal element having the second insulating film, as descried above.

Also, according to the liquid crystal display device of the present invention, it is possible to provide a highly reliable, thin, lightweight liquid crystal display device having excellent characteristics and excellent impact resistance since it is provided with thin-film two-terminal elements as described above.

What is claimed is:

1. A thin-film two-terminal element comprising:
   on a resinous substrate as an insulative substrate,
   a first metal film functioning as a wiring layer and a first electrode,
   a first insulating film formed on the first electrode of the first metal film, the first insulating film having a non-linear resistance property,
   a second metal film formed on the first insulating film, the second metal film functioning as a second electrode, and
   a second insulating film formed under the second metal film except on a portion thereof which electrically functions with the first electrode via the first insulating film, said second insulating film blocking passage of gas and/or liquid molecules generated from and/or passing through the resinous substrate.

2. A thin-film two-terminal element as set forth in claim 1, wherein the second insulating film has the function of enhancing electrical insulation in the second electrode except the portion thereof which electrically functions with the first electrode via the first insulating film.

3. A thin-film two-terminal element as set forth in claim 1, wherein the first metal film comprises a film of aluminum or tantalum.

4. A thin-film two-terminal element as set forth in any one of claims 1 and 3, wherein the first insulating film is formed by anodizing the first metal film.

5. A thin-film two-terminal element as set forth in any one of claims 1 and 3, wherein a wiring layer portion of the first metal film comprises a laminate of a third metal film having a smaller stress and a smaller electrical resistance than the first metal film.

6. A thin-film two-terminal element as set forth in claim 5 wherein a protective film is formed on an exposed surface of the third metal film.

7. A thin-film two-terminal element as set forth in claim 5 6, wherein the third metal film comprises a film of titanium, molybdenum, silver, copper, aluminum or an alloy thereof.

8. A liquid crystal display device comprising:
   an element side substrate in which a pixel electrode is formed on a thin-film two-terminal element as set forth in any one of claims 1, and 3 formed on a resinous substrate, the pixel electrode being connected to the second electrode composing the thin-film two-terminal element,
   an opposite substrate in which a transparent opposite electrode is formed on a second insulative substrate, and
   a liquid crystal layer sandwiched between the element side substrate and the opposite substrate.

9. A liquid crystal display device as set forth in claim 8, wherein the second electrode is formed integrally with the pixel electrode and as a reflection pixel electrode.

10. A process for manufacturing a thin-film two-terminal element comprising the steps of:
   forming a first metal film functioning as a first electrode on a resinous substrate as an insulative substrate,
   forming a first insulating film having a non-linear resistance property on the first electrode, and
   forming a second metal film functioning as a second electrode on the first insulating film,
   wherein, before the second metal film is formed, a second insulating film separated from the second metal film is formed on the entire surface of the insulative substrate except on an intermediate portion where the first metal film and the first insulating film are laminated.

11. A process for manufacturing a thin-film two-terminal element as set forth in claim 10, wherein the step of forming the first insulating film comprises anodization of the first metal film.

12. A process for manufacturing a thin-film two-terminal element as set forth in claim 10 or 11, further comprising the step of forming a third metal film on or under the first metal film.

13. A process for manufacturing a thin-film two-terminal element as set forth in claim 12, wherein a protective film is formed on an exposed surface of the third metal film simultaneously when the first insulating film is formed.

14. A process for manufacturing a thin-film two-terminal element as set forth in claim 13, wherein the first insulating film and the protective film are formed by an anodization method.

15. A thin-film two-terminal element comprising:

on a resinous substrate as an insulative substrate, a first metal film functioning as a wiring layer and a first electrode, a first insulating film formed on the first electrode of the first metal film, the first insulating film having a non-linear resistance property, a second metal film formed on the first insulating film, the second metal film functioning as a second electrode, and a third metal film formed in a wiring layer portion of the first metal film, the third metal film having a smaller stress and a smaller electrical resistance than the first metal film.

16. A thin-film two-terminal element as set forth in claim 15, wherein the first metal film comprises a film of aluminum or tantalum.

17. A thin-film two-terminal element as set forth in claim 15 or 16, wherein the first insulating film is formed by anodizing the first metal film.

18. A thin-film two-terminal element as set forth in any one of claims 15 or 16, wherein the third metal film comprises a film of titanium, molybdenum, silver, copper, aluminum or an alloy thereof.

19. A thin-film two-terminal element as set forth in any one of claims 15 or 16, wherein a protective film is formed on an exposed surface of the third metal film.

20. A process for manufacturing a thin-film two-terminal element as set forth in claim 15, the process comprising the steps of:

forming the first metal film functioning as the wiring layer and the first electrode on a resinous substrate as an insulative substrate, forming the third metal layer at least in a wiring layer portion of the first metal film, the third metal film having a smaller stress and a smaller electrical resistance than the first metal film, forming the first insulating film having the non-linear resistance property on the first electrode of the first metal film, and forming the second metal film functioning as the second electrode on the insulating film.

21. A process for manufacturing a thin-film two-terminal element as set forth in claim 20, wherein the step of forming the first insulating film is conducted by anodizing the first metal film.

22. A process for manufacturing a thin-film two-terminal element as set forth in claim 20 or 21, wherein a protective film is formed on a surface of the third metal film simultaneously with the step of forming the insulating film by anodizing the first metal film.

23. A liquid crystal display device comprising:

an element side substrate in which a pixel electrode is formed on an insulative substrate provided with an thin-film two-terminal element as set forth in any one of claims 15 or 16, the pixel electrode being connected to the second electrode composing the thin-film two-terminal element, an opposite substrate in which a transparent opposite electrode is formed on a second insulative substrate, and a liquid crystal layer sandwiched between the element side substrate and the opposite substrate.

24. A thin-film two-terminal element comprising:

on an insulative resin substrate, a first metal film functioning as a wiring layer and a first electrode on the insulative resin substrate, a first insulating film formed on the first electrode of the first metal film, the first insulating film having a non-linear resistance property, a second metal film formed on the first insulating film, the second metal film functioning as a second electrode, said first insulating film separating said first and second metal films, and a third metal film formed only under a wiring layer portion of the first metal film so that the third metal is coated with the first metal film, the third metal film having a smaller stress and a smaller electrical resistance than the first metal film.

25. A thin-film two-terminal element as set forth in claim 24, wherein the first metal film comprises a film of aluminum or tantalum.

26. A thin-film two-terminal element as set forth in claims 24 or 25, wherein the first insulating film is formed by anodizing the first metal film.

27. A thin-film two-terminal element as set forth in any one of claims 24 or 25, wherein the third metal film comprises a film of titanium, molybdenum, silver, copper, aluminum or an alloy thereof.

28. A process for manufacturing a thin-film two-terminal element as set forth in claim 24, the process comprising the steps of:

forming the third metal film on an insulative substrate, forming the first metal film functioning as the wiring layer and the first electrode on the third metal film, forming the first insulating film having the non-linear resistance property on the first electrode, and forming the second metal film functioning as the second electrode on the insulating film.

29. A process for manufacturing a thin-film two-terminal element as set forth in claim 28, wherein the step of forming the first insulating film comprises anodization of the first metal film.

30. A liquid crystal display device comprising:

an element side substrate in which a pixel electrode is formed on a resinous substrate provided with a thin-film two-terminal element as set forth in any one of claims 24 or 25, the pixel electrode being connected to the second electrode composing the thin-film two-terminal element, an opposite substrate in which a transparent opposite electrode is formed on a second insulative substrate, and a liquid crystal layer sandwiched between the element side substrate and the opposite substrate.

* * * * *